United States Patent
Yoshida et al.

(10) Patent No.: US 7,424,339 B2
(45) Date of Patent: Sep. 9, 2008

(54) METHOD AND SYSTEM FOR ACQUIRING DELIVERY POSITION DATA OF CARRYING APPARATUS

(75) Inventors: Tetsuya Yoshida, Kakogawa (JP); Masaya Yoshida, Himeji (JP); Shinya Kitano, Nishinomiya (JP)

(73) Assignee: Kawasaki Jukogyo Kabushiki Kaisha, Kobe (JP)

( * ) Notice: Subject to any disclaimer, the term of this patent is extended or adjusted under 35 U.S.C. 154(b) by 159 days.

(21) Appl. No.: 11/074,709

(22) Filed: Mar. 9, 2005

(65) Prior Publication Data

US 2005/0201424 A1    Sep. 15, 2005

(30) Foreign Application Priority Data

Mar. 15, 2004   (JP)   .............................. 2004-073179

(51) Int. Cl.
*G06F 7/00*   (2006.01)
*G06F 19/00*   (2006.01)
*G05B 19/18*   (2006.01)

(52) U.S. Cl. ........................ 700/218; 700/213; 700/228; 700/121; 700/56

(58) Field of Classification Search ................... 700/56, 700/218, 61, 64, 66, 213, 214, 228, 229, 700/121
See application file for complete search history.

(56) References Cited

U.S. PATENT DOCUMENTS 5,608,642 A * 3/1997 Onodera .................... 700/213
6,192,294 B1 * 2/2001 Chiba ........................ 700/214
6,510,362 B1 * 1/2003 Guillermin ................. 700/187
6,510,365 B1 * 1/2003 Nishinakayama et al. ... 700/214
6,778,874 B2 * 8/2004 Schauer ..................... 700/112
6,925,356 B2 * 8/2005 Schauer et al. ............. 700/213
2002/0111710 A1 * 8/2002 Perlov et al. ............... 700/229
2003/0233166 A1 * 12/2003 Nuebling et al. ........... 700/223

FOREIGN PATENT DOCUMENTS

| JP | A-5-166697 | 7/1993 |
|---|---|---|
| JP | A-9-102527 | 4/1997 |
| JP | A-10-64990 | 3/1998 |
| JP | A-10-135306 | 5/1998 |
| JP | A-10-156773 | 6/1998 |
| JP | A-10-270526 | 10/1998 |
| JP | A-10-313037 | 11/1998 |
| JP | A-11-163084 | 6/1999 |
| JP | 11-186360 | 9/1999 |
| JP | A-2001-338969 | 12/2001 |
| JP | A-2002-164416 | 6/2002 |
| JP | A-2003-65711 | 3/2003 |

* cited by examiner

*Primary Examiner*—Gene O. Crawford
*Assistant Examiner*—Ramya G Prakasam
(74) *Attorney, Agent, or Firm*—Oliff & Berridge, PLC

(57) ABSTRACT

In a searching step, a laser beam by a laser beam projector is projected toward an object to be detected, which is previously disposed at a delivery position, while moving a holding member which is positioned apart from the object to be detected. In a delivery position data acquiring step, delivery position data is acquired by obtaining member position data provided by a member position data detecting unit when a laser beam reflected by the object to be detected is received by a laser beam receiver and calculating the delivery position data based on the member position data obtained by the member position data detecting unit.

10 Claims, 14 Drawing Sheets

METHOD AND SYSTEM FOR ACQUIRING DELIVERY POSITION DATA OF CARRYING APPARATUS

CROSS REFERENCE TO RELATED APPLICATIONS

This application is based upon and claims the benefit of priority from the prior Japanese Patent Application No. 2004-73179, filed on Mar. 15, 2004, the entire contents of which are incorporated herein by reference.

BACKGROUND OF THE INVENTION

1. Field of the Invention

The present invention relates to method and system for acquiring delivery position data on a predetermined delivery position by a carrying apparatus.

2. Description of the Related Art

A substrate processing system for processing substrates has a plurality of processing units for processing substrates by different processes, respectively. The substrate processing system is provided with a substrate carrying apparatus that carries a substrate from one processing unit to another.

The substrate carrying apparatus needs to carry a substrate accurately to a desired position in a transfer unit included in each processing unit. Otherwise, it is possible that the substrate is processed irregularly, the substrate falls off the transfer unit and/or undesired particles adhere to the substrate.

Practically, the hand of the substrate carrying apparatus is unable to carry the substrate accurately to a desired position, the substrate cannot be correctly positioned and the substrate cannot be normally carried due to positional errors in the substrate carrying apparatus and the substrate processing system. To position the substrate accurately, a first conventional position teaching method teaches a delivery position to the substrate carrying apparatus by the manual operation of the substrate carrying apparatus by the user. However, it is practically impossible for the user to teach the delivery position to the substrate carrying apparatus by manually operating the substrate carrying apparatus. Moreover, skillful manual operation of the substrate carrying apparatus is necessary to achieve accurate teaching of the delivery position to the substrate carrying apparatus in a short time.

A second conventional position teaching method, such as a method disclosed in JP-A 11-186360, uses an object to be detected which is placed at a desired delivery position, and a detector held by the substrate carrying apparatus. The second conventional position teaching method teaches the delivery position to the substrate carrying apparatus on the basis of a value provided by an encoder at the detection of the object by the detector.

Referring to FIG. 23 showing a flow chart of a conventional delivery position teaching procedure using a detector, the delivery position teaching procedure is started in step f0 after the substrate carrying apparatus and the substrate processing system have been initialized for a delivery position teaching operation. In step f1, the operator places an object to be detected at a delivery position to which a substrate is to be carried. In step f2, the operator mounts a detector for detecting the object to be detected on the hand of the substrate carrying apparatus.

In step f3, the operator instructs the substrate carrying apparatus to move the hand to an estimated delivery position through a manual operation or on the basis of data for CAD (computer-aided design). In step f4, the operator gives a delivery position data acquisition instruction to the substrate carrying apparatus to make the substrate carrying apparatus acquire delivery position data, and then the substrate carrying apparatus acquires delivery position data automatically. More specifically, after the hand has been moved to an estimated delivery position, the hand is moved to search a position of the hand where the object is detected. The substrate carrying apparatus calculates the delivery position on the basis of a value provided by an encoder upon the detection of the object by the detector and then notifies the operator of the completion of a delivery position data acquiring operation.

Then, in step f5, the operator removes the detector from the hand and removes the object from the delivery position. The delivery position teaching procedure is ended in step f6.

A third conventional position teaching method attaches a CCD camera (charge-coupled device camera) to the hand of a carrying apparatus and determines a position to be taught to the carrying apparatus by processing images formed by the CCD camera. A system for carrying out the third conventional position teaching method is of a large scale and expensive.

The second conventional position teaching method moves the hand to the estimated delivery position where the detector is able to detect the object to be detected in step f3. The manual hand moving operation must move the hand to the estimated delivery position so that the hand may not collide with obstacles. Or, the accurate coincidence of the current condition with the CAD data is essential. The hand cannot be easily moved to the estimated delivery position when a space in which the substrate carrying apparatus operates is narrow. Acquisition of delivery position data on a delivery position for other kinds of carrying apparatuses has the same problems as those in the acquisition of delivery position data for the substrate carrying apparatus.

SUMMARY OF THE INVENTION

Accordingly, it is an object of the present invention to provide method and system for acquiring position data on delivery position by a carrying apparatus which are capable of reducing load on the operator for acquiring the delivery position data.

The present invention is a delivery position data acquiring method by which a carrying apparatus acquires delivery position data on a predetermined delivery position, the carrying apparatus including a holding member for holding an object to be delivered, member position data detecting means for detecting member position data on a position of the holding member, driving means for driving the holding member for movement, a laser beam projector disposed at a predetermined position with respect to the holding member, and a laser beam receiver disposed at a predetermined position with respect to the holding member to receive a laser beam, including: a searching step of projecting a laser beam by the laser beam projector toward an object to be detected, which is previously disposed at a delivery position, while moving the holding member which is positioned apart from the object to be detected; and a delivery position data acquiring step of acquiring delivery position data by obtaining member position data provided by the member position data detecting means when a laser beam reflected by the object to be detected is received by the laser beam receiver and calculating the delivery position data based on the member position data obtained by the member position data detecting means.

In the present invention, a laser beam is projected toward the object to be detected which is previously disposed at a delivery position. Then, member position data of the holding member is detected by the member position data detecting means when a laser beam reflected by the object to be detected is received. The member position data of the holding member thus detected corresponds to data on the delivery position where the object to be detected is disposed. Accordingly, delivery position data can be calculated on the basis of the member position data of the holding member when the reflected laser beam is received. Parallel light rays of high intensity with a small spot can be projected and received by using a laser beam. Therefore, delivery position data can be acquired with high accuracy even when the holding member is positioned apart from the delivery position. Accordingly, the position of the object to be detected can be acquired without moving the carrying apparatus into an interference space in which the carrying apparatus interferes with obstacles including other apparatus. Namely, delivery position data can be acquired while preventing the holding member from colliding with the other apparatus including the object to be detected.

Preferably, the object to be detected is provided with a regression reflection type reflector capable of reflecting an incident light in a direction parallel to and opposite a direction in which the incident light travels, and the laser beam projector and the laser beam receiver are disposed coaxially or close to each other.

The delivery position data acquiring method according to the present invention reflects the laser beam projected by the laser beam projector by the regression reflection type reflector. The regression reflection type reflector reflects incident light in a direction parallel to and opposite the direction of the incident light. The reflector is able to reflect the incident laser beam projected by the laser beam projector and fallen thereon so that the reflected laser beam falls surely on the laser beam receiver.

Preferably, the laser beam projector projects a polarized laser beam oscillating only in a predetermined first direction, the laser beam receiver receives a polarized laser beam oscillating only in a predetermined second direction, and the regression reflection type reflector converts an incident laser beam oscillating in the first direction into a reflected laser beam oscillating in the second direction.

The delivery position data acquiring method according to the present invention makes the laser beam projected by the laser beam projector and oscillating in the first direction fall on the regression reflection type reflector, makes the regression reflection type reflector reflect the reflected laser beam oscillating in the second direction, and makes the laser beam receiver receive only the reflected laser beam oscillating in the second direction. Therefore, reception of light emitted by other light sources and the laser beam projected by the laser beam projector and reflected by other devices other than the regression reflection type reflector by the laser beam receiver can be prevented. Thus the influence of optical disturbance on the delivery position data acquiring operation can be reduced.

Preferably, the carrying apparatus is provided with first driving means for driving the holding member for angular displacement about a turning axis parallel to a carrying axis set at the delivery position and apart from the delivery position, and second driving means for driving the holding member for linear displacement along a direction parallel to the turning axis, and the holding member is turned about the turning axis for angular displacement and is moved along the direction parallel to the turning axis for linear displacement in a noninterference space in which the holding member will not interfere with obstacles including other apparatus in the searching step.

The searching step of the delivery position data acquiring method according to the present invention turns the holding member about the turning axis in the noninterference space. Thus, data on the direction of the axis of the object to be detected about the turning axis can be acquired without approaching the delivery position. Delivery position data on the position of the object to be detected with respect to the turning axis can be acquired by linearly displacing the holding member along a direction parallel to the turning axis without approaching the delivery position. Thus, the interference between the carrying apparatus and other apparatus can be prevented when the delivery position data is acquired. In this specification, the term "other apparatus" is used to denote inclusively other apparatus, the object to be detected and walls.

Preferably, the laser beam projector projects the laser beam in a direction perpendicular to the turning axis.

The delivery position data acquiring method according to the present invention makes the laser beam projector project the laser beam in the direction perpendicular to the turning axis to facilitate the calculation of the delivery position data on the delivery position.

Preferably, the carrying apparatus includes an intersection detecting means disposed at a predetermined position with respect to the holding member for detecting a position of the object to be detected with respect to a direction intersecting a laser beam in a plane perpendicular to the turning axis, and third driving means for driving the holding member for movement in a direction perpendicular to the turning axis, the method further includes: a holding member translating step of moving the holding member toward the object to be detected based on the delivery position data calculated in the delivery position data acquiring step, and a radial distance acquiring step of acquiring a radial distance of the delivery position by calculating delivery position data on the delivery position based on member position data obtained by the member position data detecting means when the object to be detected is detected by the intersection detecting means.

The delivery position data acquiring method according to the present invention enables the holding member to approach the object to be detected without colliding with any obstacles by displacing the holding member on the basis of the result of calculation in the delivery position data acquiring step. Delivery position data on the position of the object to be detected on a cylindrical coordinate system having a reference axis aligned with the turning axis can be determined by calculating the radial position of the object to be detected.

Preferably, the delivery position data is calculated based on a difference between a first correction data and a second correction data, the first correction data being obtained by the member position data detecting means when the object to be detected held by the holding member is transferred to a predetermined correction setting position, and the second correction data being obtained by the member position data detecting means when the laser beam receiver receives a reflected laser beam reflected by the object to be detected positioned at the correction setting position while moving the holding member with the laser beam projector projecting the laser beam toward the object to be detected.

According to the present invention, an error in the distance between the carrying apparatus and the object to be detected can be calculated on the basis of the difference between the first and the second correction data. The influence of dimensional errors in the carrying apparatus and the object to be detected on the measurement of the delivery position can be reduced and the delivery position can be more accurately measured by calculating the delivery position on the basis of the difference between the first and the second correction data.

The present invention is a delivery position data acquiring system for acquiring delivery position data on a delivery position, including: a carrying apparatus; and an object to be detected capable of being held by the carrying apparatus, the carrying apparatus includes: a holding member for holding an object to be delivered, driving means for driving the holding member for movement, member position data detecting means for detecting member position data on a position of the holding member, a laser beam projector disposed at a predetermined position with respect to the holding member and capable of projecting a laser beam, a laser beam receiver disposed at a predetermined position with respect to the holding member and capable of receiving a laser beam, and control means for receiving member position data provided by the member position data detecting means when the laser beam receiver receives a laser beam reflected by the object to be detected and calculating delivery position data on a delivery position based on the member position data, and the object to be detected has a part to be detected which is provided with a regression reflection type reflector, the object to be detected being adapted to be held by the holding member.

The delivery position data acquiring system according to the present invention projects a laser beam on the object to be detected placed at a delivery position, and obtains delivery position data on the position of the holding member at a moment when the laser beam receiver receives the laser beam reflected by the object to be detected. The laser beam capable of forming a small spot can be easily formed by collating parallel light rays of high intensity. Therefore, the accurate delivery position data on the delivery position can be obtained by using the laser beam even if the holding member is spaced apart from the delivery position. The operator does not need to teach accurately the starting position of the holding member from which the holding member starts moving when a delivery position data acquiring operation is started to the carrying apparatus. Thus load on the operator can be reduced. Since the object to be detected is provided with the regression reflection type reflector, the laser beam receiver is able to receive the reflected laser beam stably for a laser beam receiving time period longer than that for which the laser beam receiver receives the reflected laser beam when a mirror reflector is used. Consequently, the accuracy of the delivery position data on the position of the carrying apparatus can be improved.

Preferably, the carrying apparatus is a substrate carrying apparatus for carrying a semiconductor wafer.

The delivery position data acquiring system according to the present invention carries a semiconductor wafer by the carrying apparatus. In most cases, the substrate carrying apparatus for carrying a semiconductor wafer is installed and operated in a narrow space in a clean room. Since the operator does not need to teach accurately the starting position of the holding member from which the holding member starts moving when the delivery position data acquiring operation is started to the carrying apparatus, the carrying apparatus is able to move in a narrow space without colliding with other apparatus and walls, and a delivery position data acquiring operation for acquiring delivery position data on the delivery position can be easily achieved.

According to the above-mentioned present invention, the holding member is disposed at the starting position and starts moving from the starting position at the start of the delivery position data acquiring operation, and then the laser beam is projected to find the object to be detected. Thus the operator does not have to teach accurately the starting position to the carrying apparatus and the load on the operator can be reduced. Since the delivery position data on the delivery position can be obtained with the holding member disposed at a distance from the delivery position, the starting position can be determined in a wide range. Thus the starting position can be easily determined and hence the load on the operator can be reduced.

Even if the delivery position is located in a narrow space, the holding member is able to move for the delivery position data acquiring operation for acquiring the delivery position data on the delivery position without colliding with other apparatus and walls because the delivery position data can be obtained with the holding member positioned at a distance from the delivery position.

When a semiconductor wafer held by the holding member is to be placed in a container having a narrow space for holding a plurality of semiconductor wafers, delivery position data on a delivery position to which the semiconductor wafer is to be delivered can be obtained with the holding member positioned apart from the container. Thus the collision of the holding member against the container can be prevented during the delivery position data acquiring operation.

According to the present invention, the laser beam receiver is able to receive easily the laser beam projected by the laser beam projector on the object to be detected and reflected by the object to be detected regardless of the relation between the direction of travel of the laser beam and the position of the light-receiving surface of the reflector. Therefore, positional adjustment of the laser beam projector and the laser beam receiver is unnecessary.

Since the laser beam receiver is able to receive the laser beam only if the laser beam falls on the reflector, the laser beam receiver is able to receive the laser beam for an increased light receiving time when the holding member is displaced while the laser beam is projected. Consequently, failure in measuring the delivery position data on the delivery position can be prevented and the delivery position data can be accurately determined.

The present invention prevents the reception of light emitted by other light sources and the laser beam reflected by other devices other than the regression reflection type reflector by the laser beam receiver. Thus failure in determining the delivery position data can be surely prevented. Even if other apparatus and walls having metallic luster are arranged around the carrying apparatus and the space in which the carrying apparatus operates is illuminated at a high illuminance, erroneous determination of the delivery position data on the delivery position can be prevented.

According to the present invention, the delivery position data on the object to be detected can be obtained without moving the holding member close to the delivery position. Consequently, the possibility of collision of the holding member with the object to be detected in the searching step can be reduced.

According to the present invention, the laser beam projector projects the laser beam in a direction perpendicular to the turning axis to facilitate the calculation of the delivery position data on the delivery position.

According to the present invention, the holding member translating step and the radial distance acquiring step are executed after the delivery position data acquiring step. Thus the holding member is able to approach the object to be detected without colliding against the object to be detected, and the delivery position data on the position of the delivery position is determined on the cylindrical coordinate system having its axis coinciding with the turning axis.

According to the present invention, the delivery position data on the delivery position is calculated on the basis of the member position data provided by the member position data detecting means in the searching step and the difference between the first and the second correction data. Thus the influence of dimensional errors in the carrying apparatus and the object to be detected on the measurement of the delivery position can be reduced and accurate delivery position data on the delivery position can be obtained.

According to the present invention, a laser beam is projected toward the object to be detected which has been previously disposed at the delivery position. Then, member position data of the holding member is detected by the member position data detecting means when a laser beam reflected by the object to be detected is received. Parallel beams of small spots having high intensity of light can be projected and received by using a laser beam. Therefore, delivery position data can be acquired with high accuracy even when the holding member is positioned apart from the delivery position.

Thus the operator does not need to teach accurately the starting position from which the holding member starts moving for the delivery position data acquiring operation for acquiring the delivery position data on the delivery position to the carrying apparatus and hence the load on the operator can be reduced. Since the object to be detected is provided with the regression reflection type reflector, the laser beam receiver is able to receive the laser beam for an increased period of time and accuracy in acquiring the delivery position data on the delivery position can be improved.

According to the present invention, the substrate carrying device carries a semiconductor wafer. The substrate carrying apparatus, in most cases, is operated in a narrow space in a clean room. Since the operator does not need to teach accurately the starting position from which the holding member starts moving for the delivery position data acquiring operation for acquiring the delivery position data on the delivery position to the substrate carrying apparatus, teaching work for teaching the delivery position data on the delivery position to the substrate carrying apparatus can be easily achieved.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1:
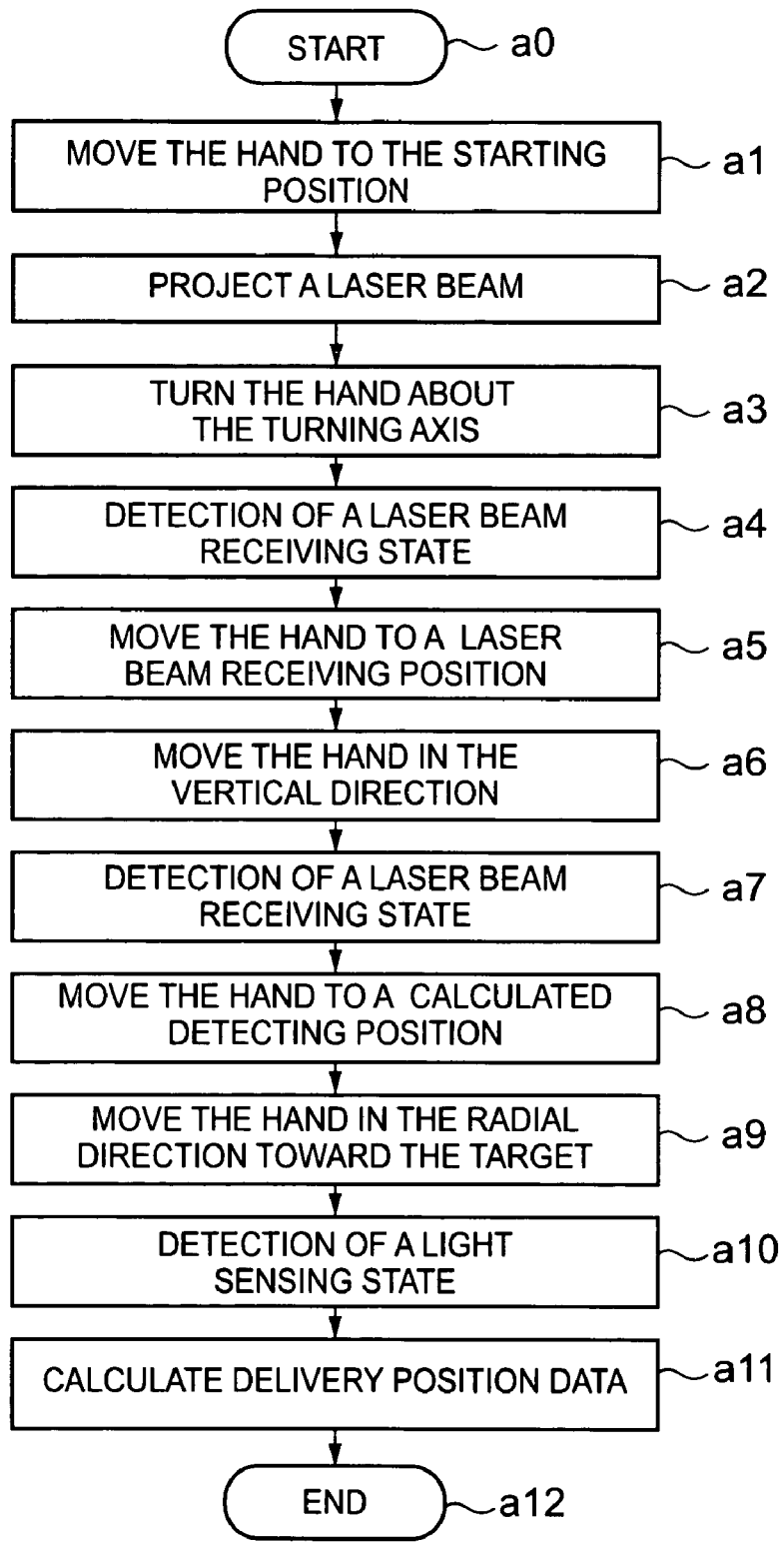
FIG. 1 is a flow chart of a delivery position data acquiring procedure included in a delivery position data acquiring method in an embodiment according to the present invention.
Figure 2:
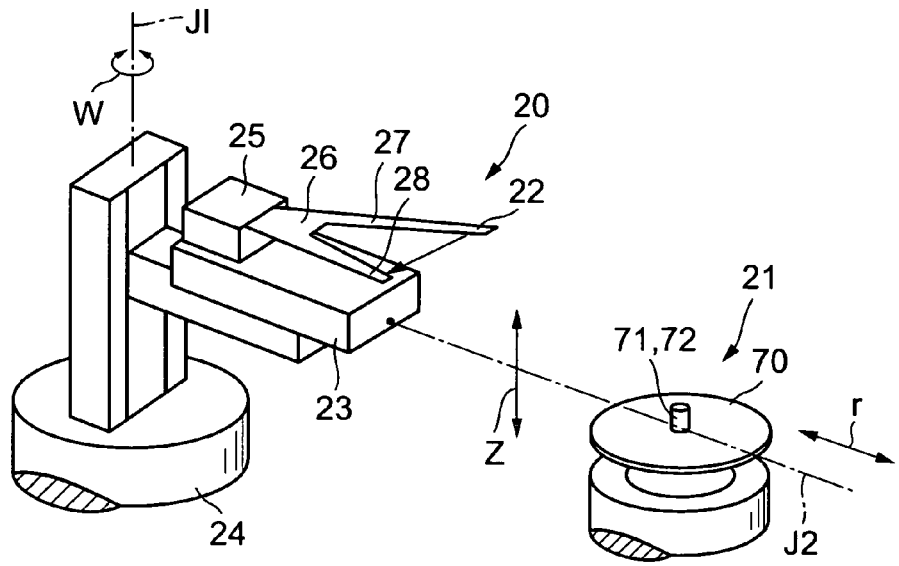
FIG. 2 is a perspective view of a carrying apparatus of a delivery position data acquiring system in an embodiment according to the present invention.

Referring to FIGS. 1 and 2, a carrying apparatus 20, which is used to carry out a delivery position data acquiring method in an embodiment of the present invention, is, for example, a substrate carrying apparatus for carrying a substrate, such as a semiconductor wafer or a glass plate for liquid crystal displays. In this description, the carrying apparatus 20 is supposed to carry a semiconductor wafer. The carrying apparatus 20 has a hand 22 for holding a semiconductor wafer. The hand 22 holding the semiconductor wafer is moved to a desired position. The semiconductor wafer is, for example, a disk of 0.7 mm in thickness and 200 mm or 300 mm in diameter. The carrying apparatus 20 may be provided with a plurality of hands 22.

The carrying apparatus 20 has a base fixedly installed at a predetermined position on the floor, the hand 22, namely, a holding member, for releasably holding a semiconductor wafer, an arm 23 provided with a joining unit 25, and a support column 24 supporting the arm 23. The base has an axis aligned with a turning axis J1. The turning axis J1 of the carrying apparatus 20 is vertical.

The support column 24 is supported for turning about the turning axis J1 on the base. A radial axis J2 extends perpendicularly to the turning axis J1. When the support column 24 is turned about the turning axis on the base, the radial axis J2 sweeps a horizontal plane perpendicular to the turning axis J1.

The arm 23 provided with the joining unit 25 is able to move vertically along the turning axis J1 and is able to move the joining unit 25 in radial directions r parallel to the radial axis J2.

Thus the hand 22 connected to the joining unit 25 of the arm 23 is able to move to a desired position on a cylindrical coordinate system having its axis aligned with the turning axis J1. The carrying apparatus 20 may be provided with any suitable mechanism capable of moving the hand 22 to a desired position instead of a mechanism including the arm 23 and the support column 24. The turning axis J1 is vertical and is parallel to a Z-axis. Directions of turning about the turning axis J1 are turning directions W, namely, turning directions W1 and W2, and directions of linear movement along the radial axis J2 are the radial directions r.

The hand 22 is formed in a shape substantially resembling a U-shape. The hand 22 has a base part 26 and a pair of elongate support parts 27 and 28. The base part 26 is joined to the joining unit 25 of the arm 23. The support parts 27 and 28 have horizontal support surfaces, respectively. A semiconductor wafer 19 is supported on the support surfaces of the support parts 27 and 28. The support parts 27 and 28 extend from the base part 26 in a horizontal plane including the radial axis J2 so as to diverge from each other with distance from the turning axis J1.

The base part 26 and the support parts 27 and 28 are provided with positioning projections, respectively. The positioning projections project upward from the support surfaces of the base part 26 and the support parts 27 and 28, respectively, so as to come into contact with the circumference of a semiconductor wafer supported on the support surfaces. The positioning projection combined with the base part 26 is moved after placing the semiconductor wafer on the hand 22. The positioning projection combined with the base part 26 comes into contact with the circumference of the semiconductor wafer, pushes the semiconductor wafer toward the positioning projections combined with the support parts 27 and 28 to position the semiconductor wafer at a predetermined holding position on the hand 22 with the three positioning projections. Thus the position data of the center of the semiconductor wafer with respect to a coordinate system set for the carrying apparatus 20 can be calculated.

The carrying apparatus 20 is installed in a semiconductor wafer processing equipment. The interior space of the semiconductor wafer processing equipment is kept in a clean atmosphere having a low dust concentration and processing units for processing semiconductor wafers are arranged in the clean interior space of the semiconductor wafer processing equipment. The carrying apparatus 20 carries a semiconductor wafer from a semiconductor wafer container to a transfer position in the semiconductor wafer processing equipment. The carrying apparatus 20 carries the semiconductor wafer processed by a predetermined process from the processing unit to the semiconductor wafer container. The carrying apparatus 20 performs a predetermined semiconductor wafer transfer procedure to transfer the semiconductor wafer from one of processing positions to another in the plurality of processing units. The processing units are those for carrying out a resist film forming process, an exposure process, a developing process and a thermal process. The transfer position and the processing positions are delivery positions.

Figure 3:
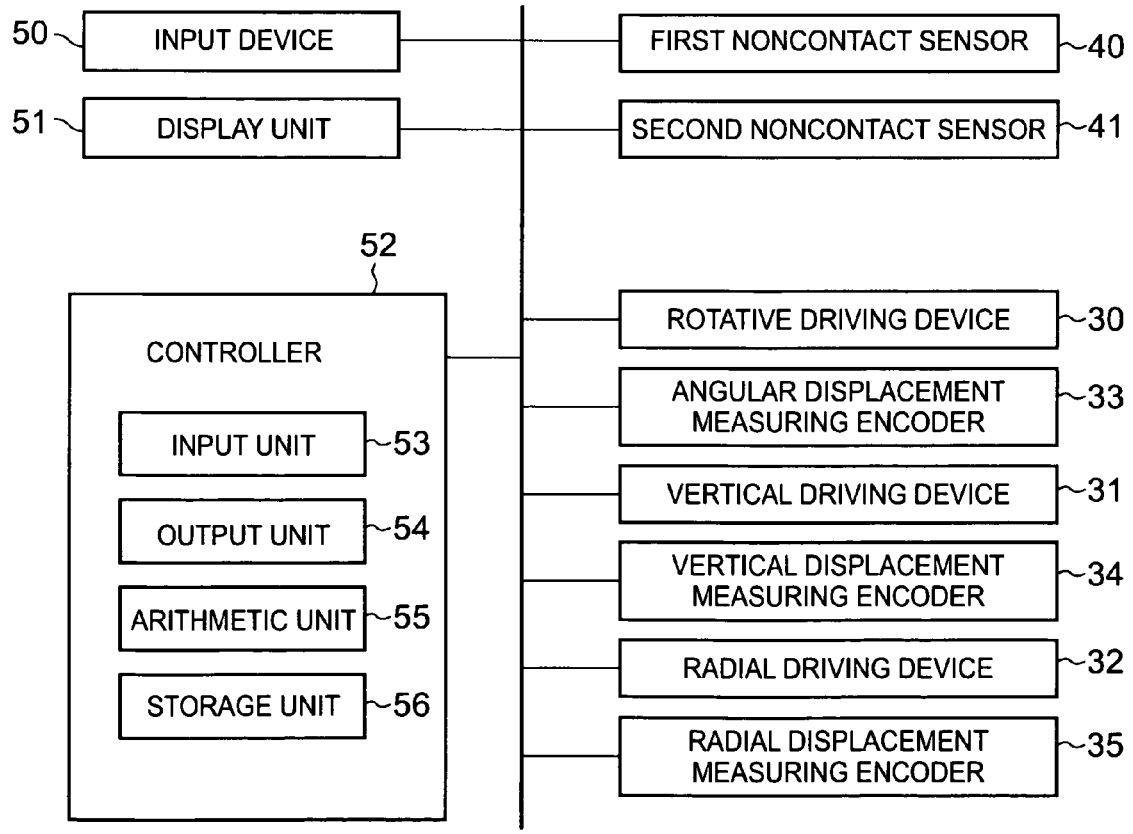
FIG. 3 is a block diagram of an electric system included in the carrying apparatus of FIG. 1.

FIG. 3 is a block diagram of an electric system included in the carrying apparatus 20. The carrying apparatus 20 has a drive system for moving the hand 22 relative to the base. The drive system includes a rotative driving device 30, namely, first driving means, for driving the support column 24 for turning in the turning directions W relative to the base, a vertical driving device 31, namely, second driving means, for driving the arm 23 for vertical movement in vertical directions Z relative to the base, and a radial driving device 32, namely, third driving means, for driving the joining unit 25 of the arm 23 for movement in the radial directions r relative to the support column 24. The driving devices 30, 31 and 32 are actuators, such as servomotors or pneumatic cylinder actuators.

The rotative driving device 30 moves the hand 22 about the turning axis J1 for angular displacement. The vertical driving device 31 moves the hand 22 for vertical displacement along the turning axis J1. The radial driving device 32 moves the hand 22 for horizontal linear displacement in the radial directions r.

The carrying apparatus 20 is provided with member position data detecting means for detecting position data on the hand 22 with respect to the base. If the driving devices 30, 31 and 32 are servomotors, the member position data detecting means includes encoders combined with the servomotors.

The carrying apparatus 20 includes an angular displacement measuring encoder 33, a vertical displacement measuring encoder 34 and a radial displacement measuring encoder 35. The angular displacement measuring encoder 33 detects position data on the position of the hand 22 with respect to the turning directions W. The vertical displacement measuring encoder 34 detects position data on the vertical position of the hand 22 with respect to the vertical directions Z. The radial displacement measuring encoder 35 detects position data on the radial position of the hand 22 with respect to the radial directions r.

The carrying apparatus 20 is provided with a first noncontact sensor 40 and a second noncontact sensor 41 to detect a target 21 to be detected. The first noncontact sensor 40 is mounted on the arm 23. The first noncontact sensor 40 projects a laser beam in a direction parallel to or coaxially with the radial axis J2 to detect the target 21. The second noncontact sensor 41 is mounted on the hand 22. The second noncontact sensor 41 projects a sensing light beam in a direction perpendicular to a plane containing the turning axis J1 and the radial axis J2 to detect the target 21. The sensing light beam is emitted by a light source, such as a semiconductor laser or a light-emitting diode.

The carrying apparatus 20 has an input device 50 to be operated by the operator to enter instructions and a display unit 51 for displaying the condition of work. The input device 50 is, for example, a push-button panel or a touch panel. The display unit 51 is, for example, a liquid crystal display. The input device 50 and the display unit 51 of the carrying apparatus 20 may be incorporated into a teaching pendant.

The carrying apparatus 20 has a controller 52. The controller 52 controls the driving devices 30, 31 and 32 on the basis of position data provided by the encoders 33, 34 and 35. The controller 52 controls the driving devices 30, 31 and 32 and the noncontact sensors 40 and 41 in compliance with instructions entered by operating the input device 50. The controller 52 makes the display unit 51 display information about the condition of operations.

The controller 52 has an input unit 53, an output unit 54, an arithmetic unit 55 and a storage unit 56. Position data on the position of the target 21 detected by the encoders 33, 34 and 35, and the noncontact sensors 40 and 41 is given to the input unit 53. Calculated data calculated by the arithmetic unit 55 is sent to the driving devices 30, 31 and 32 and the noncontact sensors 40 and 41 through the output unit 54. For example, the output unit 54 sends calculated driving inputs to the driving devices 30, 31 and 32. The display unit 51 displays information about the condition of operations.

The storage unit 56 stores computing programs to be executed by the arithmetic unit 55 and temporarily stores data calculated by the arithmetic unit 55. For example, the storage unit 56 stores delivery position data on a delivery position calculated by the arithmetic unit 55. The arithmetic unit 55 reads the computing program from the storage unit 56 and executes the computing program to obtain delivery position data on the delivery position.

Practically, the controller 52 is a robot controller including a computer. For example, the input unit 53 and the output unit 54 are incorporated into an interface board. Practically, the arithmetic unit 55, namely, an arithmetic circuit, is a CPU (central processing unit). The storage unit 56 includes storage devices, such as a RAM (random-access memory) and a ROM (read-only memory).

Figure 4:
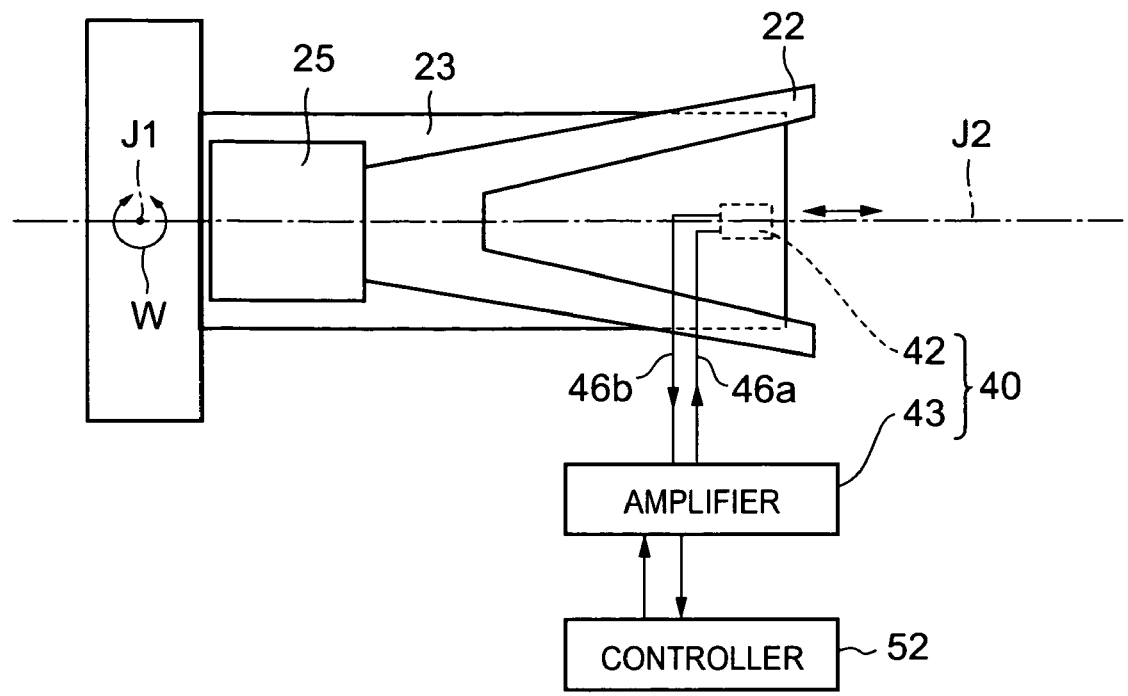
FIG. 4 is a plan view of a first noncontact sensor.

FIG. 4 is a plan view of assistance in explaining the disposition of the first noncontact sensor 40. The first noncontact sensor 40 has a sensor head 42 and an amplifier 43. The sensor head 42 is placed at a predetermined position with respect to the hand 22. The sensor head 42 moves together with the hand 22 in the circumferential directions W and the vertical directions Z. The sensor head 42 is fixed to the arm 23.

Figure 5:
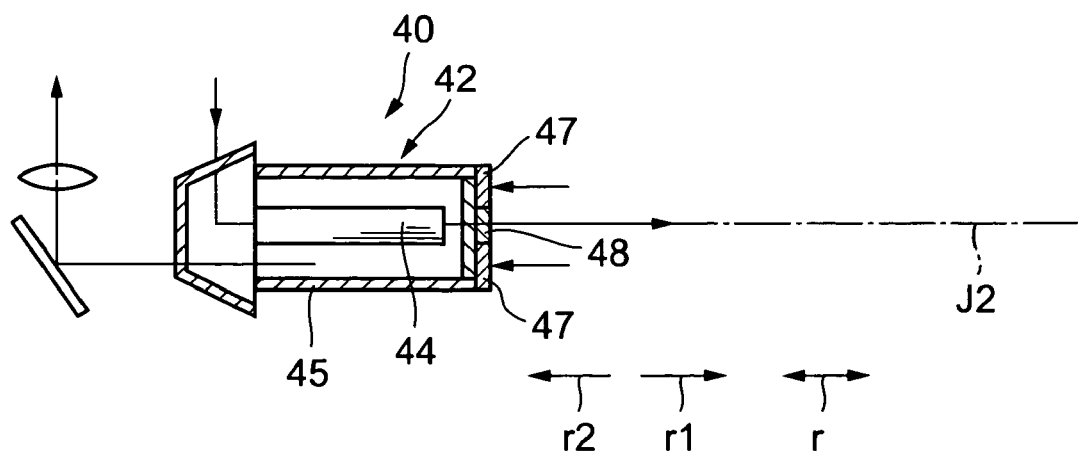
FIG. 5 is an enlarged sectional view of a sensing head.

FIG. 5 is an enlarged sectional view of the sensor head 42. The sensor head 42 has a laser beam projector 44 and a laser beam receiver 45. The laser beam projector 44 projects a laser beam coaxial with the radial axis J2 and traveling in a first radial direction r1. The laser beam receiver 45 receives a laser beam coaxial with the radial axis J2 and traveling in a second radial direction r2. The laser beam projector 44 and the laser beam receiver 45 of the sensor head 42 are combined integrally in a unit.

A first amplifier 43 is electrically connected to the sensor head 42 by cables 46a and 46b. The first amplifier 43 makes the laser beam projector 44 project a laser beam on the basis of a beam projection signal given thereto by the controller 52. The first amplifier 43 gives the controller 52 a beam reception signal indicating a laser beam receiving condition of the laser beam receiver 45. The laser beam projector 44 is provided with a semiconductor laser as a light source for emitting laser light. The semiconductor laser may be incorporated into the sensor head 42 or the first amplifier 43. The laser beam receiver 45 is provided with a light-receiving device. The light-receiving device may be incorporated into the sensor head 42 or the first amplifier 43.

Preferably, the laser beam projector 44 projects a collimated laser beam capable of forming a spot of a small diameter and of reaching a distant position. The laser beam projected by the laser beam projector is, for example, a beam of visible laser light rays of 650 nm in wavelength classified in Class 2 specified by International Electrotechnical Commission (IEC). Preferably, the laser beam forms a spot of 2 mm or below in diameter on a plane at a distance of 1 m from the laser beam projector 44. To obtain data on the delivery position to which a semiconductor wafer is to be delivered, it is desirable that the first noncontact sensor 40 has an effective target detecting distance of 1 m or above for detecting the target 21.

The laser beam projector 44 is provided with a first polarizing filter 47. The first polarizing filter 47 passes only laser light oscillating in a predetermined first direction. Thus the laser beam projector 44 projects only a laser beam oscillating in the first direction. The laser beam receiver 45 is provided with a second polarizing filter 48. The second polarizing filter 48 passes only laser light oscillating in a predetermined second direction. Thus the laser beam receiver 45 receives only a laser beam oscillating in the second direction.

Figure 6:
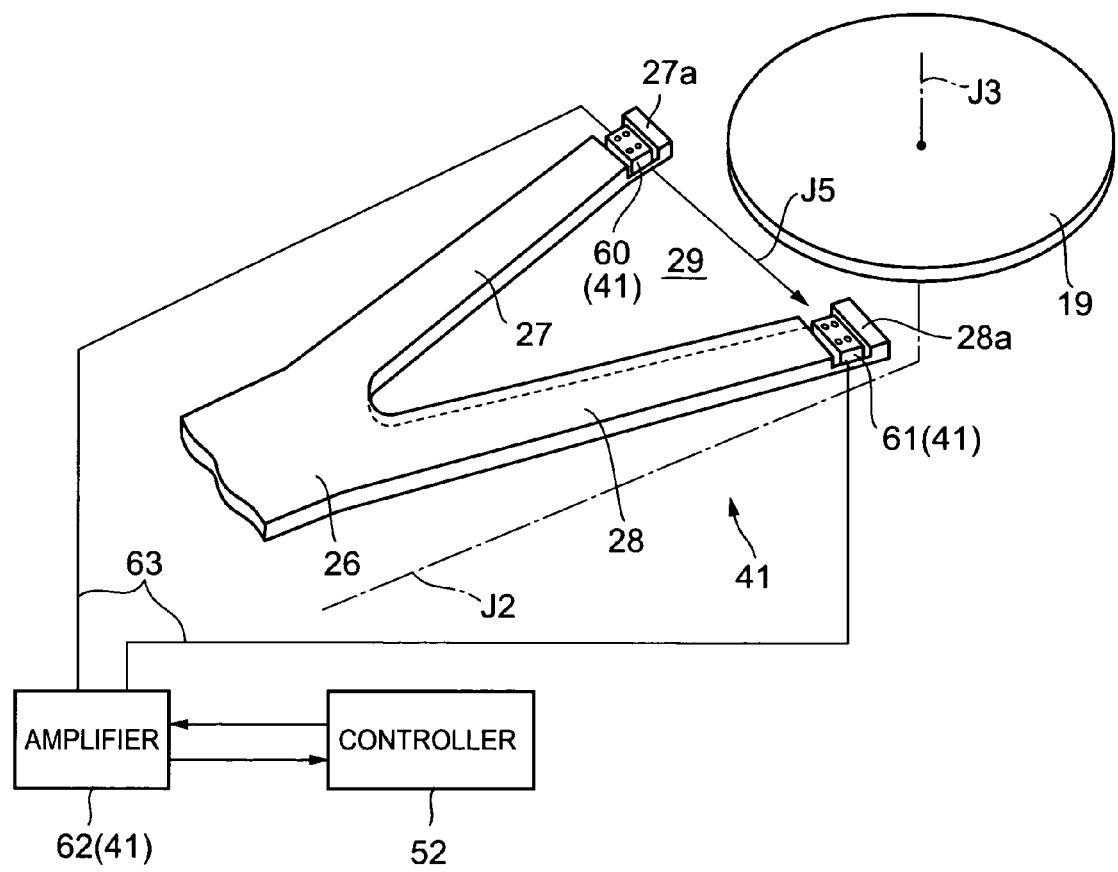
FIG. 6 is a perspective view of a second noncontact sensor.

FIG. 6 is a perspective view of assistance in explaining the disposition of the second noncontact sensor 41. The second noncontact sensor 41 has a second light projector 60, a second light receiver 61 and an amplifier 62. The second noncontact sensor 41 detects semiconductor wafers stacked in a predetermined direction, specifically, the vertical direction Z for the present embodiment. The second noncontact sensor 41 is used for mapping the semiconductor wafers.

The second light projector 60 is placed on an end part 27a of the support part 27. The second light receiver 61 is placed on an end part 28a of the support part 28. A space 29 extends between the respective end parts 27a and 28a of the support parts 27 and 28. The second light projector 60 and the second light receiver 61 are disposed such that a sensing light beam having a sensor axis J5, namely, optical axis, and projected by the second light projector 60 travels across the space 29 and falls on the second light receiver 61. The sensor axis J5 of the sensing light beam is included in a plane perpendicular to the turning axis J1.

The sensor axis J5 is perpendicular to a plane containing the turning axis J1 and the radial axis J2. The positional relation between the sensor axis J5 and the radial axis J2 is predetermined. The predetermined positional relation is stored in the storage unit 56. More specifically, the vertical distance between a horizontal plane containing the sensor axis J5 and a horizontal plane containing the radial axis J2 is stored in the storage unit 56 of the controller 52. The hand 22 is symmetrical with respect to a plane containing the turning axis J1 and the radial axis J2.

The carrying apparatus 20 moves the hand 22 toward a semiconductor wafer 19 along the radial axis J2 intersecting the axis J3 of the semiconductor wafer 19 to receive a part of the semiconductor wafer 19 in the space 29. Then, the sensing light beam projected by the second light projector 60 falls on the circumference of the semiconductor wafer 19. Consequently, the sensing light beam projected by the second light projector 60 is unable to fall on the second light receiver 61.

The second amplifier 62 is optically connected to the second light projector 60 and the second light receiver 61 by optical fibers 63. The second amplifier 62 is provided with a light-emitting device and a light-receiving device. Light emitted by the light-emitting device and transmitted to the second light projector 60 by the optical fiber 63 is projected in a sensing light beam by the second light projector 60. Light received by the second light receiver 61 is transmitted to the second amplifier 62 by the optical fiber 63.

The second amplifier 62 gives a signal indicating the reception or nonreception of the sensing light beam by the second light receiver 61 to the controller 52. The second amplifier 62 makes the light-emitting device emit light upon the reception of a light projection instruction from the controller 52. The light-emitting device of the second noncontact sensor 41 is, for example, a light-emitting diode.

Figure 7:
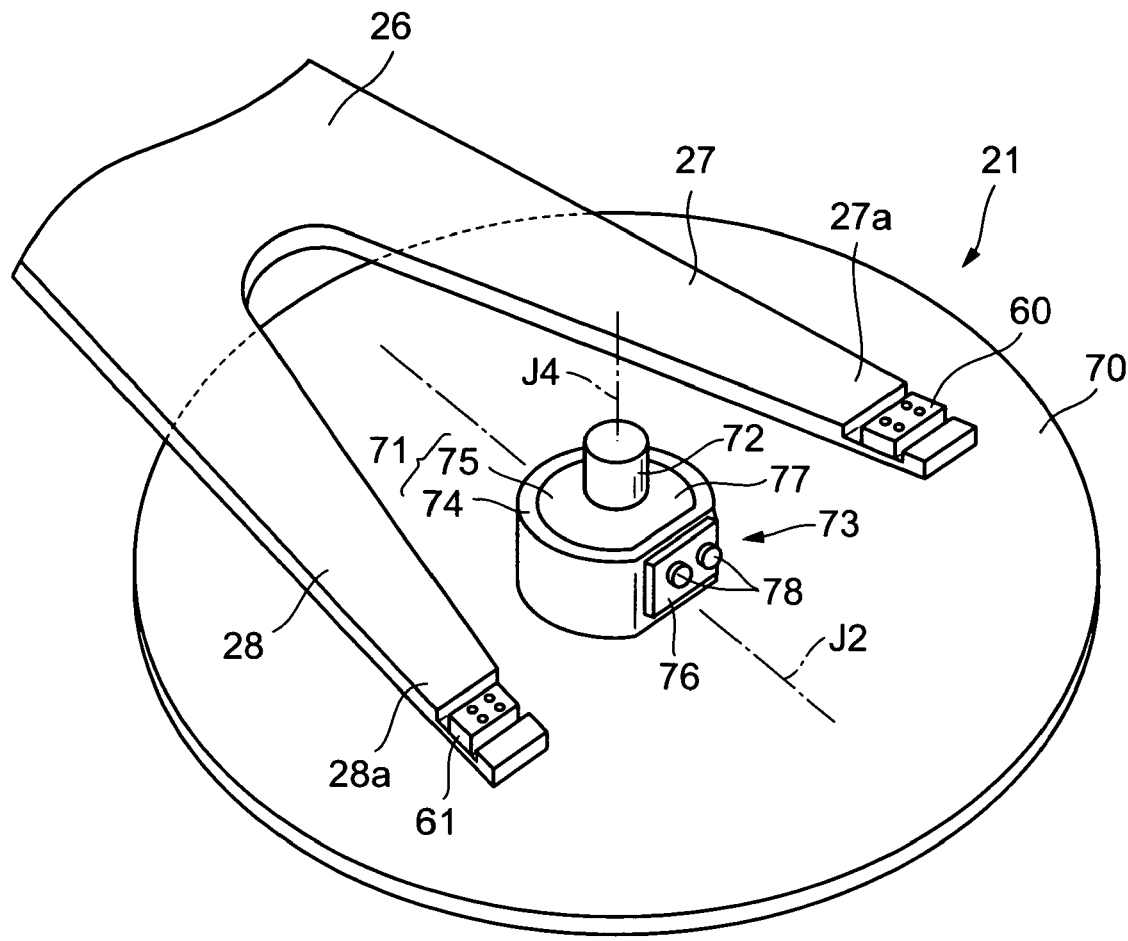
FIG. 7 is a perspective view of a target to be detected.

FIG. 7 is a perspective view of the target 21. The carrying apparatus 20 moves the hand 22 with a laser beam projected from the laser beam projector 44 toward the target 21 disposed at a position corresponding to the delivery position. The target 21 is an object to be detected by the noncontact sensors 40 and 41. The target 21 reflects the laser beam fallen thereon. When the laser beam receiver 45 receives the laser beam reflected by the target 21, the carrying apparatus 20 obtains data on the position of the target 21 by the angular displacement measuring encoder 33 and the vertical displacement measuring encoder 34 and calculates delivery position data on the delivery position on the basis of the data obtained by the angular displacement measuring encoder 33 and the vertical displacement measuring encoder 34.

The hand 22 is able to hold the target 21. The target 21 is held by the hand 22 in a predetermined positional relation with the hand 22. The respective axes J3 and J4 of the semiconductor wafer 19 and the target 21 are aligned when the semiconductor wafer 19 and the target 21 are held by the hand 22. More specifically, the target 21 has a circular body 70 resembling the semiconductor wafer 19, and a substantially cylindrical projection 73 coaxially projecting from the body 70. The projection 73 has a first part 71 to be detected and a second part 72 to be detected. A regression reflection type reflector (hereinafter, referred to simply as "reflector") 74 is attached to the projection 73.

Figure 8:
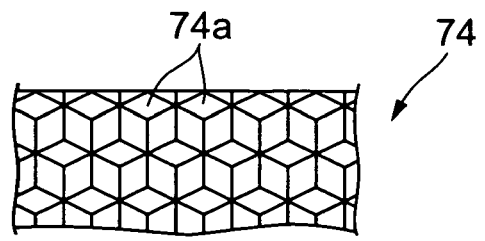
FIG. 8 is an enlarged front elevation of the reflecting surface of a reflector.

As shown in an enlarged front elevation in FIG. 8, the surface of the reflector 74 is provided with a plurality of tetrahedral corner cubes 74a. Each corner cube 74a has one transmitting surface and three reflecting surfaces perpendicularly intersecting each other. Light incident on the transmitting surface of each corner cube 74a is reflected by the reflecting surfaces so as to travel outside through the transmitting surface. The corner cubes 74a are arranged contiguously with their transmitting surfaces extended parallel to an imaginary plane. As mentioned above, the reflector 74 reflects incident light in a direction of reflection opposite a direction of incidence. The reflector 74 converts incident light oscillating in the first direction into reflected light oscillating in the second direction. The reflector 74 is flexible and is formed of, for example, a resin.

Figure 9:
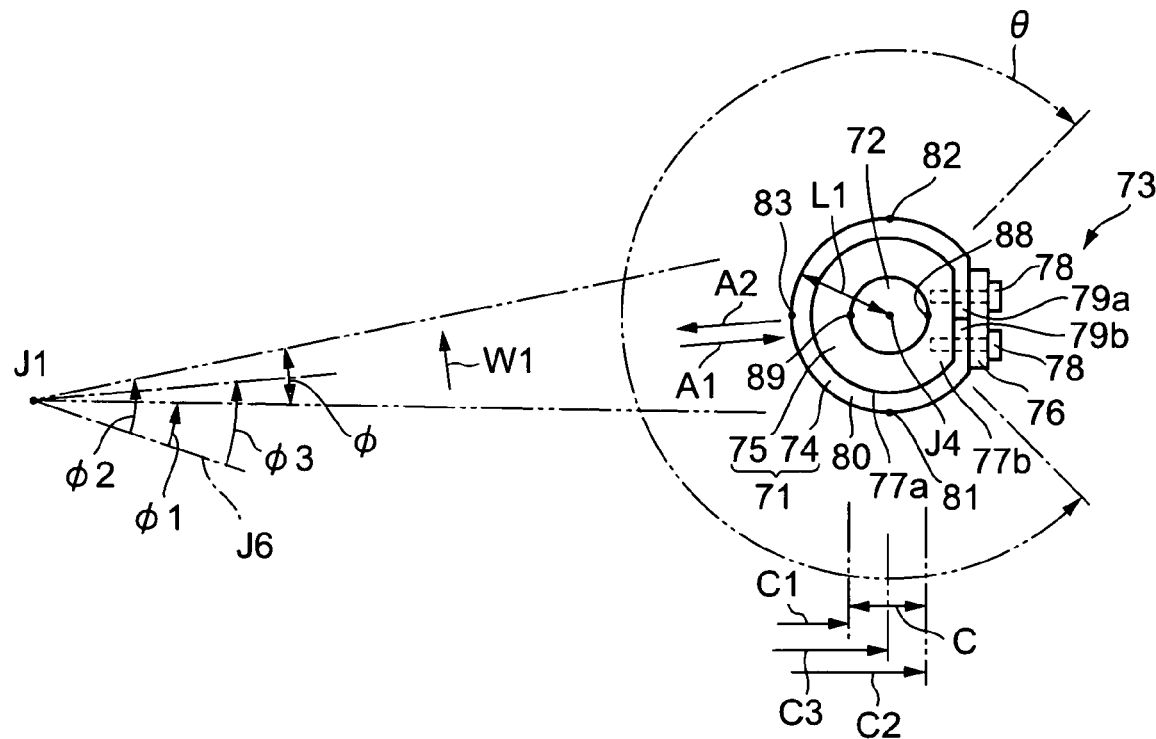
FIG. 9 is a plan view of a projection.
Figure 10:
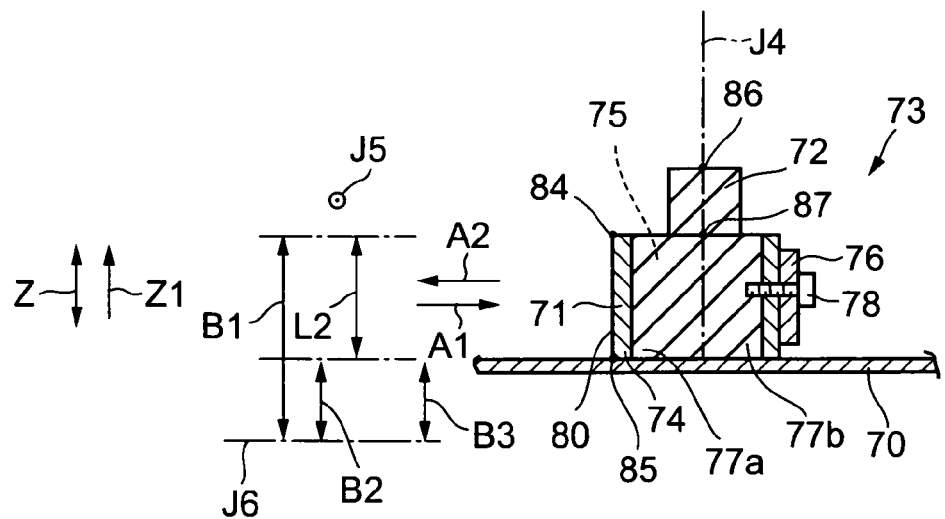
FIG. 10 is a sectional view of the projection.

FIGS. 9 and 10 are a plan view and a sectional view, respectively, of the projection 73. The first part 71 is fixed to the body 70 so as to project in a direction Z parallel to the thickness of the body 70 from the body 70. The second part 72 is fixed to the first part 71 so as to project in the direction Z1 from the first part 71.

The first part 71 has a base 75 and the reflector 74. The base 75 has a substantially cylindrical, curved surface 77a and a flat surface 77b formed by cutting a part of the curved surface 77a parallel to the axis thereof. The base 75 is fixed to the body 70 such that the axis of a cylinder enveloping the base 75 is aligned with the axis J4 of the body 70. The curved surface 77a extends in a circular range corresponding to an arc of a circle having a central angle θ of 180° or above, preferably, 270 ° or above.

The reflector 74 is attached to the curved surface 77a of the base 75 so as to conform to the curved surface 77a. Thus, the reflector 74 extends along the cylindrical surface of a cylinder having a center axis aligned with the axis J4 of the target 21. The reflector 74 is fastened to the flat surface 77b with bolts 78. A flat part of the reflector 74 is placed between the flat surface 77b and a plate 76, and the plate 76 is fastened to the base 75 with the bolts 78 to hold the flat part of the reflector 74 firmly between the flat surface 77b and the plate 76. The curved outer surface 80 of the reflector 74 is contained in a cylindrical plane having a radius L1. Since the opposite circumferential ends 79a and 79b of the reflector 74 are held between the plate 76 and the base 74, the curved outer surface 80 is smooth. For example, the first part 71 is 20 mm in diameter and 10 mm in height.

The laser beam is projected by the laser beam projector 44 so as to fall on the reflector 74 in an incident direction A1 and is reflected by the reflector 74 in a reflecting direction A2 opposite the incident direction A1. The reflected laser beam falls on the laser beam receiver 45. Since the reflector 74 thus reflects the laser beam, the laser beam receiver 45 receives the reflected laser beam for a period in which the laser beam falls on the reflector when the laser beam is projected while the hand 22 is being moved.

A reference axis J6 is fixed with respect to the base perpendicularly to the turning axis J1. When the hand 22 is turned about the turning axis J1 in the turning direction W1 with respect to the reference axis J6 fixed with respect to the base, the radial axis J2 approaches the reflector 74. Then, the laser beam falls on an entrance region 81 in the curved outer surface 80, the laser beam sweeps the entrance region 80 as the hand 22 turns about the turning axis J1, and leaves the reflector 74 after the radial axis J2 has entered an exit region 82 in the curved outer surface 80 as the radial axis J2 moves away from the reflector 74.

The laser beam receiver 45 is able to receive the laser beam in a period between the entrance of the radial axis J2 into the entrance region 81 and exit of the radial axis J2 from the exit region. Thus when the hand 22 is turned about the turning axis J1, the laser beam receiver 45 receives the laser beam while the hand 22 turns through an angle φ from the reference axis J6. Suppose that an entrance angle φ1 is an angle between the radial axis J2 and the reference axis J6 when the radial axis J2 enters the entrance region 81, and an exit angle φ2 is an angle between the radial axis J2 and the reference axis J6 when the radial axis J2 exits the exit region 82. An angle φ3 between a perpendicular line connecting the turning axis J1 and the axis J4 of the target 21 is expressed by an expression: φ3={(φ2−φ1)/2}+φ1.

When the hand 22 is turned about the turning axis J1 for angular displacement, the light receiving condition of the laser beam receiver 45 is examined, and the angular displacement measuring encoder 33 determines the entrance angle φ1 at which the laser beam receiver 45 starts receiving the laser beam and the exit angle φ2 at which the laser beam receiver 45 stops receiving the laser beam. The angle φ3 measured from the reference axis J6 in the circumferential direction W1 can be calculated by using the foregoing expression. Since the curved surface 77a extends in a circular range corresponding to an arc of a circle having a central angle θ of 180° or above, the angle φ3 can be determined even if the target 21 is not placed with the circumferentially central region 83 of the curved surface 77a accurately facing the turning axis J1.

When hand 22 is moved vertically upward in the vertical direction Z1 while the laser beam is being received by the laser beam receiver 45, the radial axis J2 moves upward past the upper end 84 of the reflector 74 and leaves the reflector 74. The laser beam receiver receives the laser beam until the radial axis J2 leaves the upper end 84 of the reflector 74. After the radial axis J2 has moved upward past the upper end 84 at an upper exit height B1 from the reference axis J6, the laser beam receiver 45 does not receive the laser beam. Suppose that the height of the upper end 84 of the reflector 74 from the base 70 is L2, the height B2 of the upper surface of the base 70 of the target 21 can be expressed by: B2=B1−L2.

Data on the shape of the target 21 including the height L2 of the upper surface of the base 70 of the target 21 from the reference axis J6 is stored beforehand in the storage unit 56 of the controller 52. The position of the center of the target 21 can be calculated on the basis of the upper exit height B1 determined by the vertical displacement measuring encoder 34 by examining the laser beam receiving condition of the laser beam receiver 45 when the hand 22 is moved in the vertical directions Z. The height B2 of the upper surface of the base 70 of the target 21 may be determined on the basis of a lower exit height B3 of a position where the laser beam receiver 45 stop receiving the laser beam when the arm 22 is moved downward from the reference axis J6. The height B2 of the upper surface of the base 70 of the target 21 may be determined on the basis of the upper exit height B1 and the lower exit height B3.

The cylindrical second part 72 is fixed to the first part 71 so as to project upward. The first part 71 and the second part 72 are coaxial. When the sensing light beam projected by the second light projector 60 falls on the second part 72, the sensing light beam is intercepted by the second part 72 and is unable to fall on the second light receiver 61.

The sensor axis J5 is positioned at a height between the upper end 86 and the lower end 87 of the second part 72. When the hand 22 is moved in the radial direction r with the radial axis J2 intersecting the axis J4 of the target 21, the sensor axis J5 approaches the second part 72. The sensor axis J5 comes into contact with an entrance point 89 of the circumference of the second part 72, moves through the second part 72 and leaves an exit point 88 of the circumference of the second part 72. Then, the sensor axis J5 moves away from the second part 72.

The second light receiver 61 does not receive the sensing light beam projected by the second light projector 60 in a period between a moment when the sensor axis J5 comes into contact with the entrance point 89 and a moment when the sensor axis J5 leaves the exit point 88. Thus, when the hand 22 is moved in the radial direction r, the second light receiver 61 does not receive the sensing light beam while the sensor axis J5 moves through a blinded range C. Suppose that the sensor axis J5 is at a first radial position C1 when the sensor axis J5 comes into contact with the entrance point 89 and is at a second radial position C2 when the sensor axis J5 leaves the exit point 88 and the axis J4 of the target 21 is at a third radial position C3. Then, the third radial position C3 is expressed by an expression: $C3=\{(C2-C1)/2\}+C1$.

The radial displacement measuring encoder 35 measures the first radial position C1 and the second radial position C2 while the hand 22 is being moved in the radial direction r. The radial position of the axis J4 of the target 21 with respect to the turning axis J1 can be calculated on the basis of the radial positions C1 and C2 measured by the radial displacement measuring encoder 35.

Figure 11:
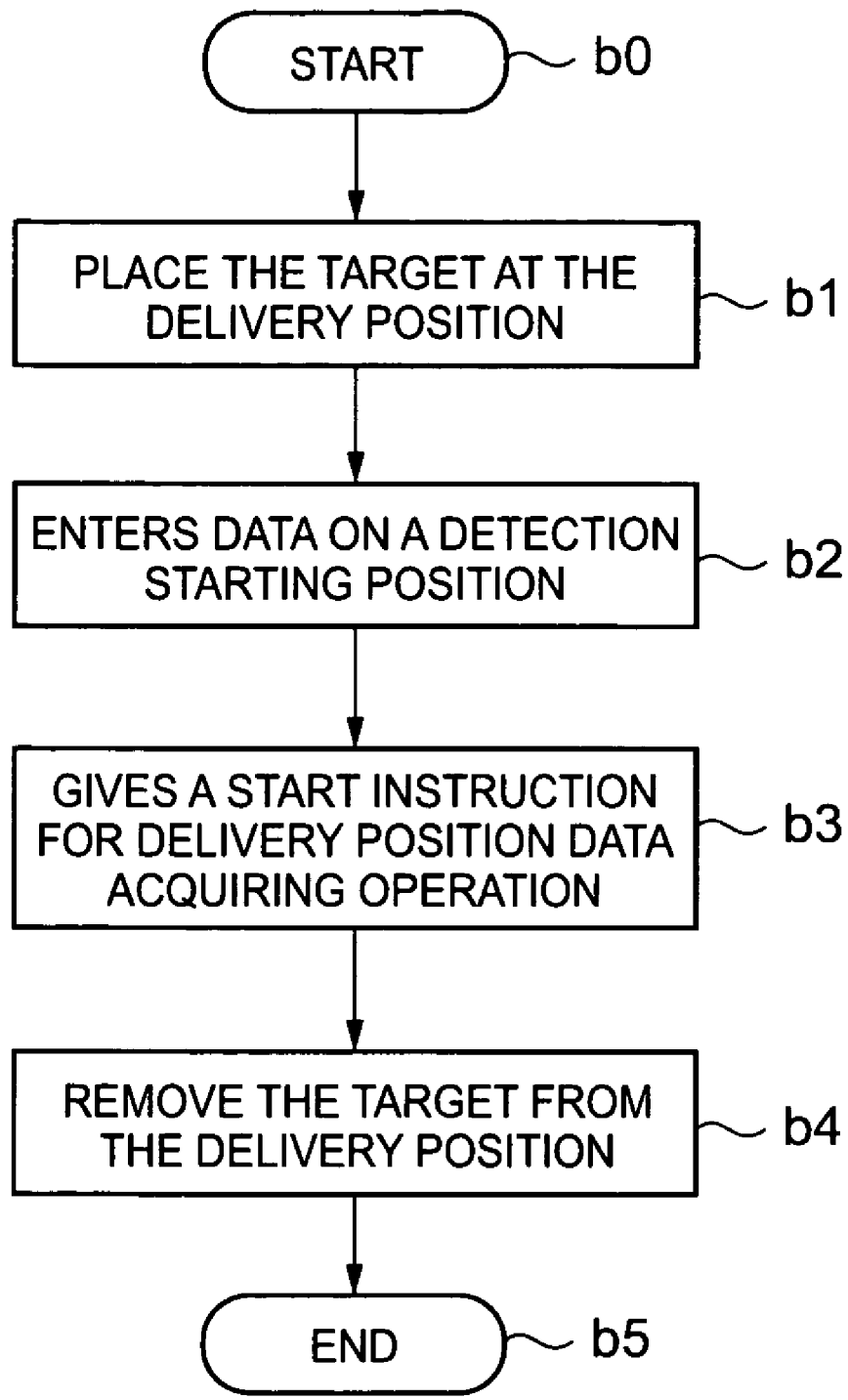
FIG. 11 is a flow chart of a delivery position data acquiring procedure to be carried out by an operator.

FIG. 11 is a flow chart of a procedure to be carried out by the operator for the delivery position data acquiring method. The operator installs the carrying apparatus 20 in the processing equipment and specifies a delivery position in step b0. Then, the operator starts an auxiliary procedure for acquiring delivery position data on the delivery position in step b1.

In step b1, the operator places the target 21 at the delivery position. If the delivery position is a position where the hand 22 places a semiconductor wafer in a container, the operator places the target 11 at a position where a semiconductor wafer will be placed in the container. The target 21 is so disposed that the circumferentially central region 83 of the curved surface 77a of the first part 71 may face the turning axis J1 as accurately as possible. After the target 21 has been thus disposed, step b2 is executed.

In step b2, the operator enters CAD data on a starting position where the hand 22 is placed at the start of the delivery position data acquiring operation into the carrying apparatus 20 by a manual or automatic operation. When the hand 22 is placed at the starting position, the radial axis J2 is at a level corresponding to that of a point between the upper end 84 and the lower end 85 of the reflector 74 of the target 21. The data on the starting position entered by operating the input device 50 is stored in the storage unit 56 of the carrying apparatus 20. After the starting position of the hand 22 has been thus determined and stored in the storing unit 56 of the carrying apparatus 20, step b3 is executed.

In step b3, the operator gives the carrying apparatus 20 an instruction to start a delivery position data acquiring operation. Then, the carrying apparatus 20 starts a delivery position data acquiring operation. Step b4 is started after the carrying apparatus 20 has informed the operator of the completion of the delivery position data acquiring operation. In step b4, the target 21 is removed from the delivery position. The auxiliary procedure is ended in step b5.

As shown in FIG. 1, which is a flow chart of a delivery position data acquiring procedure to be executed by the controller 52 included in a delivery position data acquiring system in an embodiment according to the present invention, the operator gives an instruction to start the delivery position data acquiring procedure in step a0.

In step a1, the data on the delivery position is read from the storage unit 56, the driving devices 30 to 32 are controlled to move the hand 22 to the starting position. In step a2, the controller 52 drives the laser beam projector 44 to project a laser beam. In step a3, the controller 52 controls the rotative driving device 30 to turn the hand 22 about the turning axis J1 for angular displacement. Step a3 is a searching step.

Figure 12:
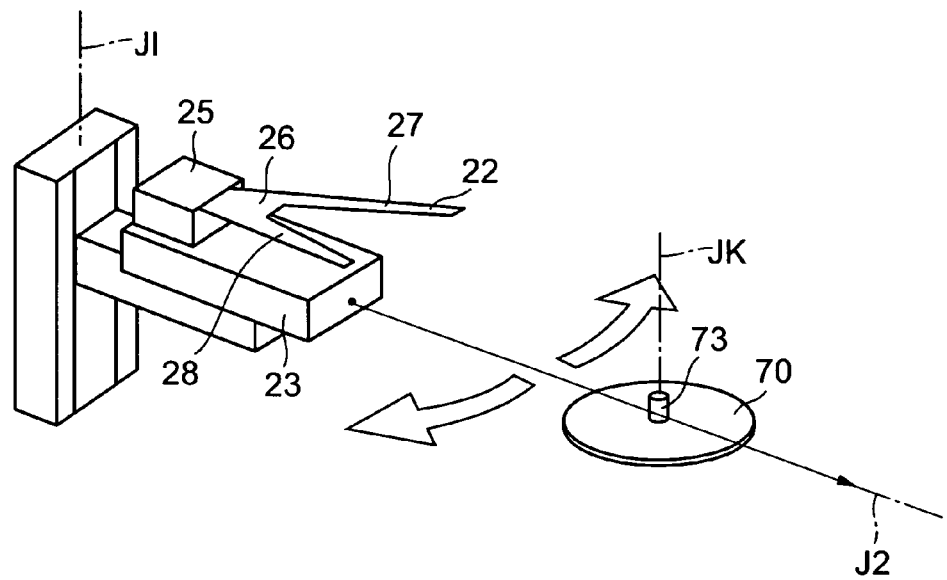
FIG. 12 is a perspective view of assistance in explaining an operation for turning a hand about a turning axis.
Figure 13:
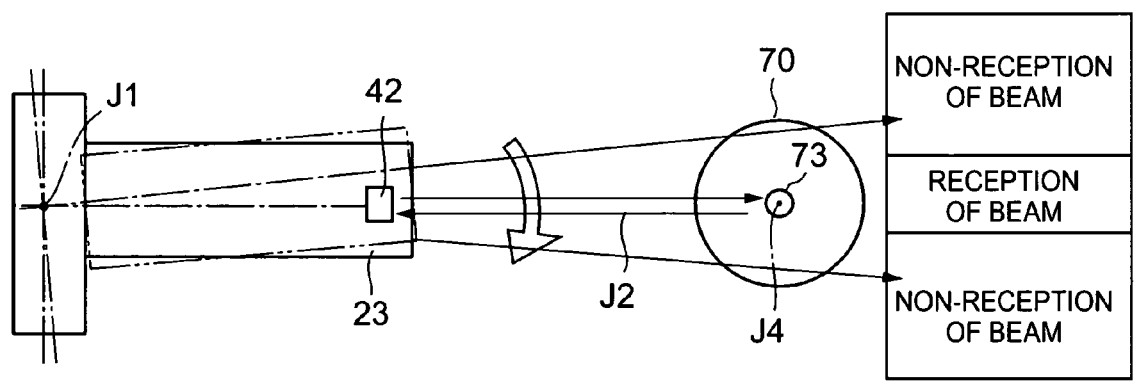
FIG. 13 is a plan view of assistance in explaining an operation for turning the hand about a turning axis.

FIGS. 12 and 13 are a perspective view and a plan view, respectively, of assistance in explaining an operation for turning the hand 22 about the turning axis J1. When the hand 22 is turned about the turning axis J1 for angular displacement in step a3, the laser beam receiver 45 is able to receive the laser beam reflected by the reflector 74 while the projected laser beam is turning in the angular range of the angle φ. In step a4, the controller 52 determines the entrance angle φ1 and the exit angle φ2 on the basis of data provided by the laser beam receiver 45 and the angular displacement measuring encoder 33. Step a4 is a delivery position data acquiring step for calculating delivery position data.

Then, in step a5, the controller 52 moves the hand 22 to a position where the laser beam receiver 45 is able to receive the reflected laser beam. Then, the controller controls the vertical driving device 31 to move the hand 22 in the vertical direction Z in step a5. Step a5 is a searching step.

Figure 14:
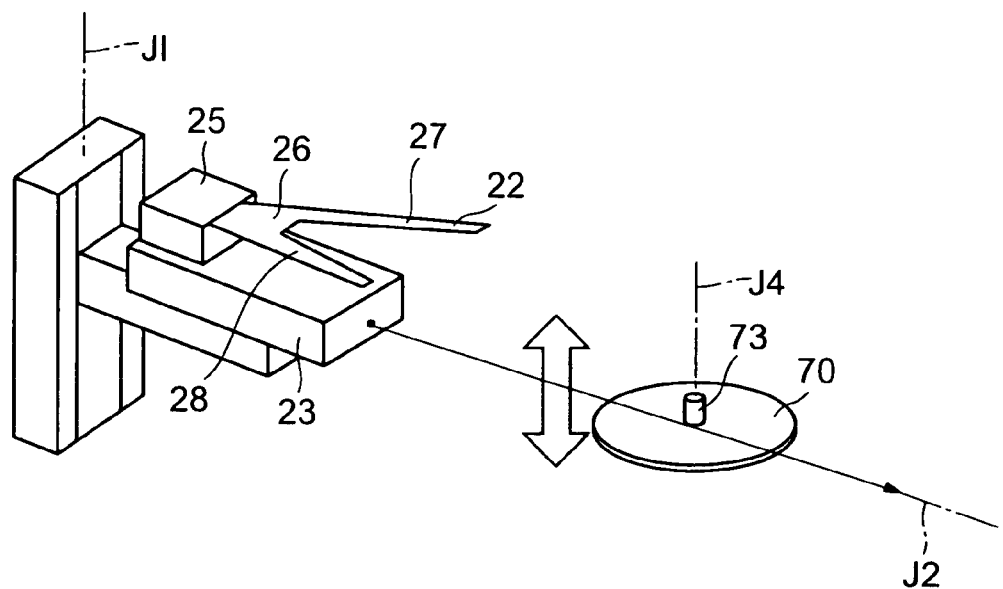
FIG. 14 is a perspective view of assistance in explaining the vertical movement of the hand.
Figure 15:
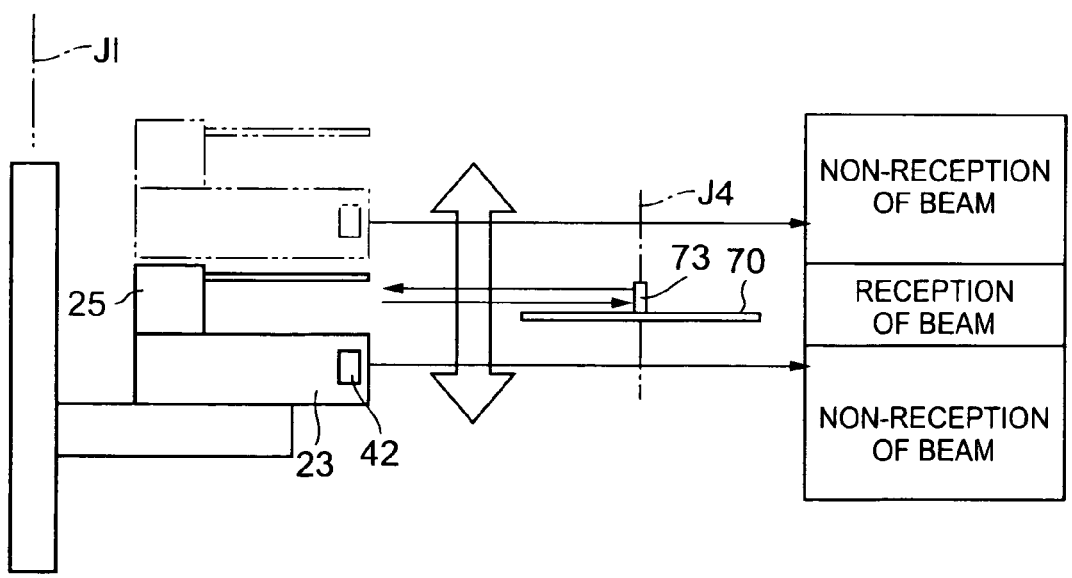
FIG. 15 is a side elevation of assistance in explaining the vertical movement of the hand along a Z-axis.

FIGS. 14 and 15 are a perspective view and a side elevation, respectively, of assistance in explaining the vertical movement of the hand 22. When the hand 22 is moved in the vertical direction Z1 in step a6, the radial axis J2 moves upward beyond a level corresponding to that of the upper end 84 of the reflector 74 and, consequently, the laser beam receiver 45 stops receiving the reflected laser beam. In step a7, the controller 52 examines the laser beam receiving condition of the laser beam receiver 45 and determines the height B1 of the upper end 84 of the reflector 74 on the basis of data provided by the vertical displacement measuring encoder 34. Step a7 is a delivery position data acquiring step for calculating delivery position data on the delivery position.

Preferably, the operation of the laser beam projector 45 for projecting the laser beam is stopped after step a7 has been executed to prevent an unnecessary projection of the laser beam and to enhance safety.

In step a8, the controller 52 calculates the angle φ3 between the perpendicular line connecting the turning axis J1 and the axis J4 of the target 21 on the basis of the entrance angle φ1 and the exit angle φ2 obtained in step a4.

The controller 52 calculates the position of the center of the target 21 with respect to the vertical direction Z on the basis of the height B1 obtained in step a7 and data on the shape of the target 21. The controller 52 calculates data on the position of the hand 22 when the sensor axis J5 is at a level corresponding to that of a point between the upper end 89 and the lower end 87 of the second part 72 and the radial axis J2 intersects the axis J5 of the target 21 on the basis of the calculated data. Then, the controller 52 controls the rotative driving device 30 and the vertical driving device 31 to move the hand 22 to a position indicated by the calculated data.

In step a9, the controller 52 controls the radial driving device 32 to move the hand 22 in the radial direction r toward the target 21. Step a9 is a holding member translating step for moving the hand 22 toward the target 21.

Figure 16:
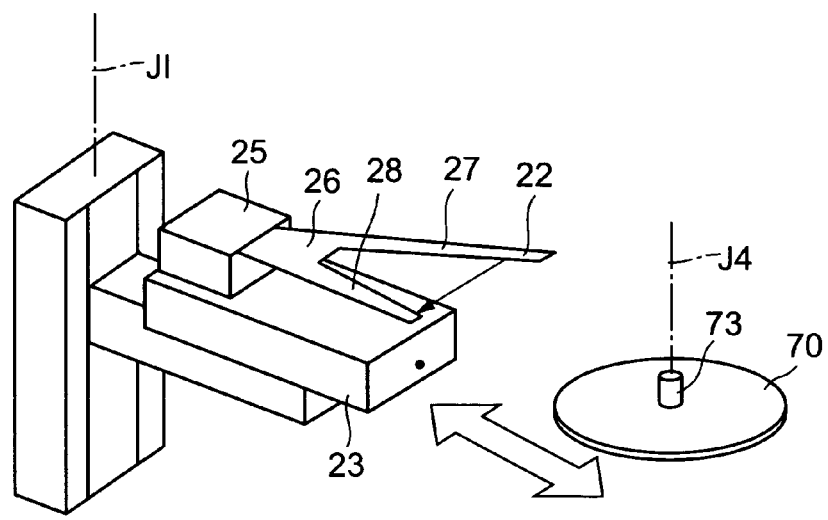
FIG. 16 is a plan view of assistance in explaining the horizontal movement of the hand in radial directions.
Figure 17:
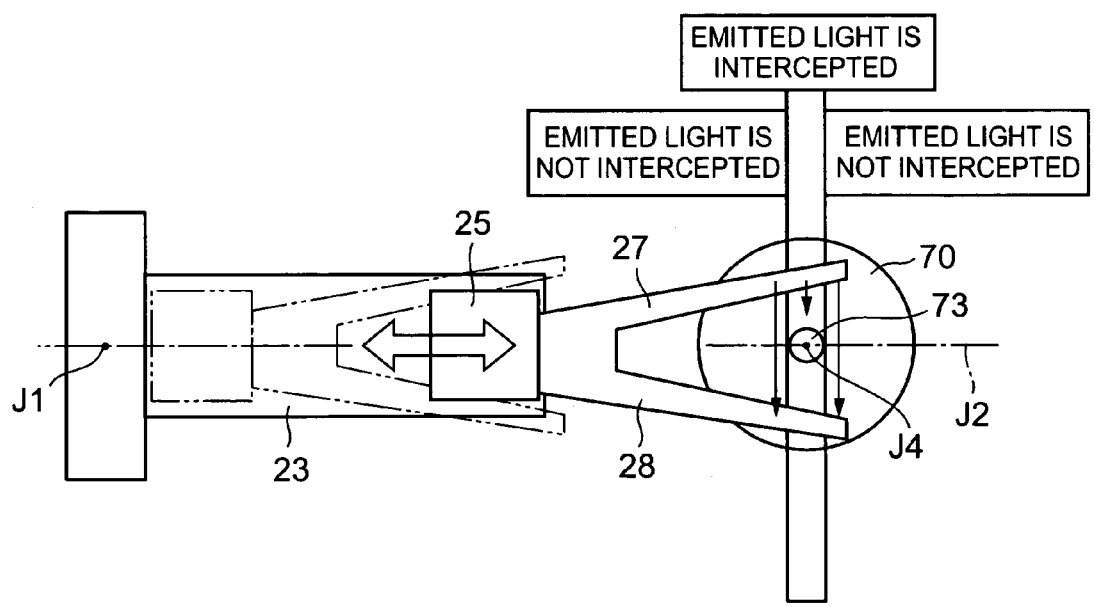
FIG. 17 is a plan view of assistance in explaining the horizontal movement of the hand in radial directions.

FIGS. 16 and 17 are a perspective view and a plan view, respectively, of assistance in explaining an operation for translating the hand 22 in the radial direction r. When the hand 22 is moved in the radial direction r, the sensing light beam traveling along the sensor axis J5 is intercepted by the second part 72 and the second light receiver 61 is unable to receive the sensing light beam while the sensing axis J5 is moving in the blinded range C. The controller 52 receives data on the first radial position C1 and the second radial position C2 from the radial displacement encoder 35 in step a10.

In step all, data on the radial position of the axis J4 of the target 21 with respect to the turning axis J1 is calculated on the basis of measured data obtained in step a10. Accordingly, step all is a radial distance acquiring step of calculating delivery position data. The controller 52 acquires delivery position data on the delivery position where the target 21 is disposed on the basis of the position data of the target 21 obtained in steps a4, a7 and all and shape data on the shape of the target 21.

In step a12, the controller 52 controls the driving devices 30, 31 and 32 to move the hand 22 to a predetermined home position. Then, the delivery position data acquiring procedure is ended. If the condition of the laser beam receiver 45 does not change even if the hand 22 is turned in opposite directions several times about the turning axis J1, an error signal indicating failure in detecting the target 21 may be provided and the delivery position data acquiring procedure may be interrupted.

As apparent from the foregoing description, in the delivery position data acquiring method in the present embodiment according to the present invention, the laser beam is projected on the target 21 disposed at the delivery position. The data on the delivery position is calculated on the basis of the data provided by the encoders 33 and 34 at the moment of reception of the reflected laser beam by the laser beam receiver 45. The laser beam is capable of easily forming parallel light rays having small spots with high intensity. The use of the laser beam makes it possible to perform the more accurate measurement of the delivery position in comparison to the use of light emitted by a light-emitting diode even if the hand 22 is positioned apart from the target 21.

Therefore, the hand 22 does not need to be moved close to the delivery position to acquire the delivery position data. Consequently, the delivery position data on the delivery position can be acquired without moving the hand 22 in an interference space in which the hand 22 may possibly interfere with the substrate processing apparatus and/or the walls of the substrate processing equipment. The delivery position acquiring method can be carried out by the simple delivery position data acquiring system employing the first noncontact sensor 40 and the reflector 74. The delivery position data acquiring system is far less expensive than a delivery position data acquiring system employing a CCD camera and an image processing device.

In most cases, semiconductor wafers are processed in a clean room and only a narrow space is available in a semiconductor wafer processing equipment. Therefore, a large space is not available for the free movement of the hand 22. The space available for the movement of the hand 22 around the delivery position is reduced still more when a plurality of semiconductor wafers are held in a container and when the processing unit is disposed at the delivery position. According to the present invention, the delivery position data can be automatically obtained without locating the hand 22 close to the delivery position. Consequently, the collision of the hand 22 with other apparatuses can be avoided when the delivery position data is acquired.

When a semiconductor wafer is carried to a position, the position of the semiconductor wafer needs to be determined in a high accuracy. Use of the laser beam and the reflector for reflecting the laser beam makes it possible to determine the position of the semiconductor wafer in a satisfactorily high accuracy. The present embodiment makes it possible to determine the position of the semiconductor wafer in accuracy substantially equal to that in positioning the carrying apparatus 20. Namely, the accuracy in determining the position of the semiconductor wafer is as high as $1/100$ mm.

The hand 22 is turned in the turning directions W and moved in the vertical directions Z to acquire the delivery position data on the delivery position. Therefore, in step b2, the operator does not need to teach accurately the starting position from which the hand 22 starts moving when the delivery position data acquiring operation is started to the carrying apparatus 20. Thus load on the operator can be reduced. Since the delivery position data on the delivery position can be obtained while the hand 22 is being placed apart from the delivery position, the range for the starting position can be expanded. Thus the starting position can be simply determined and the load on the operator can be further reduced.

Steps a3 and a6 are searching steps in which the hand 22 is displaced with the laser beam projector 44 projecting the laser beam toward the target 21. The hand 22 is turned in the turning directions W in step a3 and the hand 22 is moved vertically in the vertical directions Z in step a6. Thus the angular position data on the delivery position around the turning axis J1 and the vertical position data on the target 21 with respect to the vertical directions Z can be obtained. The movement of the hand 22 toward the target 21 can be controlled on the basis of those data so that the hand 22 may not collide with obstacles.

The hand 22 is translated in the radial direction r in step a9 after executing steps a3 and a6. Therefore, the delivery position data on the delivery position on the cylindrical coordinate system having its axis aligned with the turning axis J1 can be obtained without being accompanied by the collision of the hand 22 with the target 21. When the substrate processing system has a plurality of delivery positions, delivery position data on the plurality of delivery positions may be obtained by a method that obtains delivery position data on one of the plurality of delivery positions by the foregoing delivery position data acquiring procedure, and calculates delivery position data on the rest of the delivery positions on the basis of the delivery position data obtained by the delivery position data acquiring procedure. Delivery position data on the plurality of delivery positions can be obtained in a short time by this method.

The reflector 74 reflects the laser beam projected by the laser beam projector 44 toward a position near the laser beam projector 44. Therefore, the laser beam projector 44 and the laser beam receiver 45 can be disposed close to each other and hence the first noncontact sensor 40 has a small size. Since the laser beam receiver 45 can be made to receive the laser beam simply by reflecting the laser beam projected by the laser beam projector 44 by the reflector 74, the laser beam receiver 45 can receive the laser beam for an extended period of time. Therefore, even if the hand 22 is positioned at a distance from the delivery position, failure in obtaining delivery position data on the delivery position can be prevented and accurate delivery position data can be obtained.

The laser beam projector 44 and the laser beam receiver 45 are provided with the polarizing filters 47 and 48, respectively, and hence the reflector 74 reflects the polarized incident laser beam. Therefore, the laser beam receiver 45 is able to receive only the laser beam projected by the laser beam projector 44 and reflected by the reflector 74. Thus reception of light emitted by other light sources and the laser beam projected by the laser beam projector 44 and reflected by other devices other than the reflector 74 by the laser beam receiver 45 can be prevented. Consequently, even if the hand 22 is positioned at a distance from the delivery position, failure in obtaining delivery position data on the delivery position can be surely prevented. For example, even if other apparatus and walls having metallic luster are arranged around the carrying apparatus 20 and the space in which the carrying apparatus 20 operates is illuminated at a high illuminance, erroneous determination of the delivery position data on the delivery position can be prevented.

The projection and reflection of the laser beam along the radial axis J2 facilitate the calculation of the delivery position data. Since the sensor head 42 is incorporated into the arm 23, any work for mounting a conventional sensor holder holding a sensor on and removing the same from the arm is not necessary. The cable for transmitting signals provided by the sensor is concealed in the carrying apparatus 20 and does not interfere with the movement of the hand 22. Since the sensor head 42 is mounted on the arm 23, the hand 22 can be formed in a small size and the hand 22 will not cause any troubles in a semiconductor carrying operation. Since the respective axes of the laser beam projector 44 and the laser beam receiver 45 are aligned with the radial axis J2, the positional adjustment of the laser beam projector 44 and the laser beam receiver 45 can be easily achieved even if the laser beam forms a spot of a small diameter.

When a mapping sensor is used for determining the position of the target 21 with respect to the radial direction r, any additional sensor for determining the delivery position is not necessary and increase in manufacturing costs can be suppressed. When a fiber sensor is used as the mapping sensor, the hand 22 can be formed in a small size and a small weight. Intersection detecting means as a sensor for determining the position of the target 21 with respect to a direction intersecting the laser beam in a plane perpendicular to the turning axis J1 may be used without using the mapping sensor.

The flexible reflector 74 is attached to the curved surface 77a of the base 75 of the target 21 to form the curved outer surface 80. The reflector 74, as compared with a cylindrical reflector, can be easily formed at a low cost. Since the flat part of the reflector 74 is held between the base 75 and the plate 76, the reflector 74 will not come off the base 75 and the outer surface 80 of the reflector 74 can be formed in a shape closely resembling a cylindrical shape. The outer surface 80 of the reflector having the shape closely resembling a cylindrical shape improves accuracy in acquiring delivery position data on the delivery position. Since the curved surface 77a extends in a circular range corresponding to an arc of a circle having a central angle θ of 180° or above, the delivery position data on the delivery position can be obtained even if the target 21 is not placed with the circumferentially central region 83 of the curved surface 77a accurately facing the turning axis J1. Thus the operator is able to place the target 21 at the delivery position. Since the second part 72 is coaxial with the axis J4 of the target 21, the distance between the second light projector 60 and the second light receiver 61 can be reduced and the hand 22 can be formed in a small size.

Figure 18:
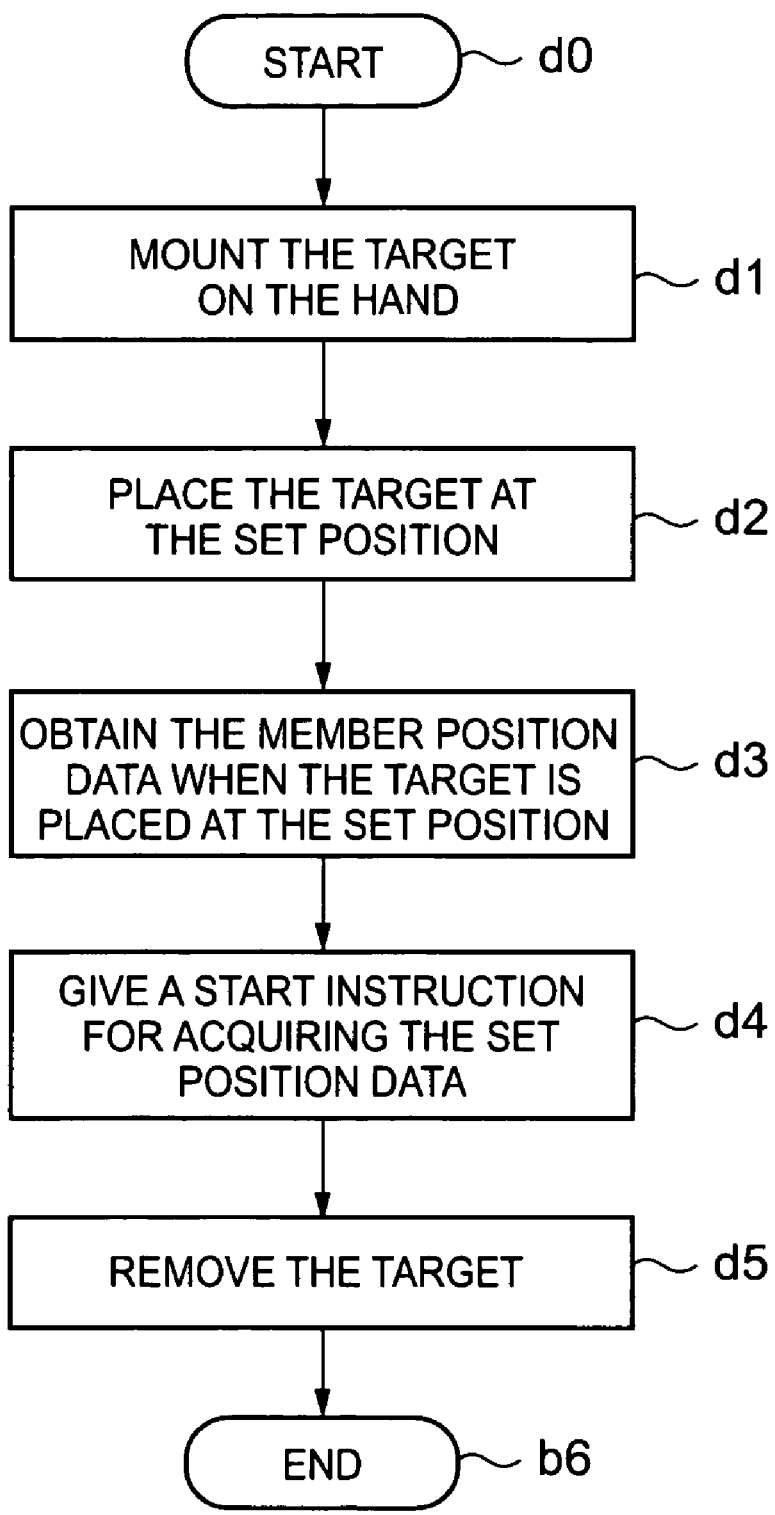
FIG. 18 is a flow chart of an auxiliary offset measuring procedure to be carried out by the operator.

FIG. 18 is a flow chart of an auxiliary offset measuring procedure to be carried out by the operator. Preferably, the operator makes the carrying apparatus 20 obtain an offset, namely, a correction relating to the carrying apparatus 20 and the target 21, before making the carrying apparatus 20 starts the delivery position data acquiring operation.

The operator specifies a set position for obtaining an offset to start the auxiliary offset measuring procedure in step d0. The operator mounts the target 21 on the hand 22 in step d1. The operator operates the hand 22 manually to place the target 21 at the set position in step d2. The carrying apparatus 20 obtains data on the position of the target 21 when the target 21 is placed at the set position by the hand 22 in step d3.

In step d4, the carrying apparatus 20 executes steps of a set position data acquiring procedure similar to steps a1 to a11 shown in FIG. 1 to obtain the data on the set position. The carrying apparatus 20 calculates an offset, namely, a difference between a specified position specified in step d3 and a measured position determined by using the noncontact sensors 40 and 41 in step d4. After the carrying device 20 has calculated the offset in step d4, the operator removes the target 21 in step d5. The auxiliary offset measuring procedure is ended in step d6. After the offset has been thus determined, steps b0 to b5 shown in FIG. 11 are executed.

The offset thus obtained is used for correcting errors between the carrying apparatus 20 and the target 21. Therefore, the set position is specified for position correction and does not need to coincide with the delivery position. For example, the offset may be determined during the manufacture of the carrying apparatus 20 at a place other than a place where semiconductor wafers are processed. Thus the set position can be set in a space only few obstacles exist and the target 21 mounted on the hand 22 can be easily moved to the set position by a manual operation.

Figure 19:
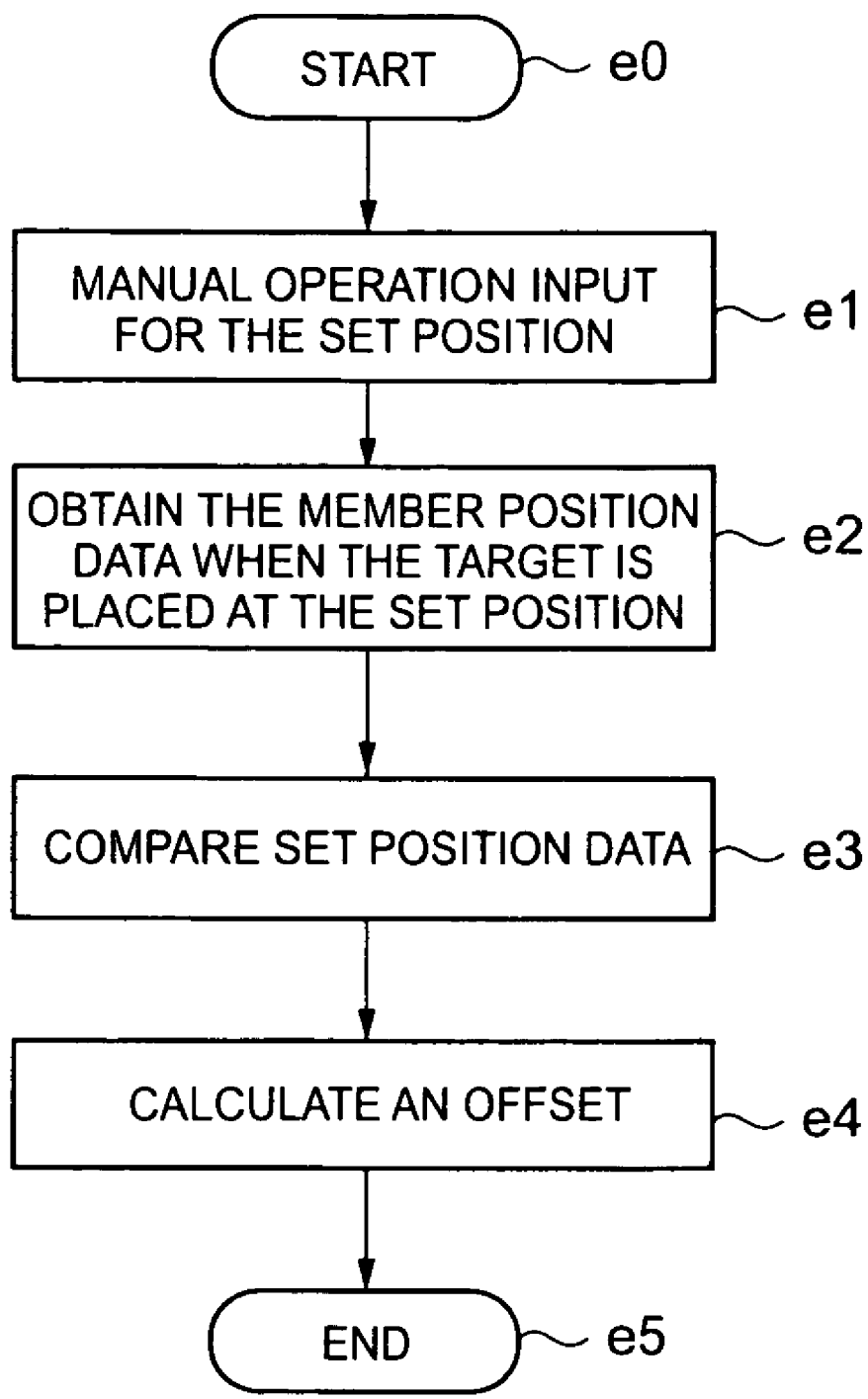
FIG. 19 is a flow chart of an offset measuring procedure to be carried out by a carrying apparatus.

FIG. 19 is a flow chart of an offset measuring procedure to be carried out by the carrying apparatus 20. The offset measuring procedure is started in step e0. The controller 52 executes the offset measuring procedure in step e1. In step e1, the operator gives the controller 52 a manual operation instruction, the controller controls the driving devices 30, 31 and 32, the hand 22 holding the target 21 is operated manually to place the target 21 at a predetermined set position.

In step e2, the operator gives the controller 52 a signal indicating the placement of the target 21 at the set position. Then, controller 52 receives position data on the position of the hand 22 in a state where the target 21 is placed at the set position from the encoders 33, 34 and 35. In step e3, the delivery position data acquiring procedure shown in FIG. 1 is executed with the target 21 placed at the set position and position data on the set position is acquired by using the first noncontact sensor 40 and the second noncontact sensor 41.

In step e4, the controller 52 compares first correction data, namely, respective position data obtained in step e2, and second correction data, namely, respective position data obtained in step e3, and calculates an offset, namely, a difference between position data measured by the noncontact sensors 40 and 41 and position data obtained when the hand 22 is placed at a set position. The offset measuring procedure is ended in step e5.

The detection deviation of the carrying apparatus 20 from a correct position when the target 21 is used can be known by taking the offset into consideration. Therefore, the carrying apparatus 20 is able to suppress the influence of dimensional errors in the target 21 and the carrying apparatus 20 by calculating the delivery position data on the delivery position in step a11 of the procedure shown in FIG. 1, taking the offset into consideration. Thus the delivery position data on the delivery position can be more accurately calculated.

Thus, when the target 21 held by the hand 22 is carried to the set position, the delivery position data on the delivery position is calculated on the basis of the difference between the first correction data, namely, the position data obtained by the encoders 33, 34 and 35 when the target 21 held by the hand 22 is placed at the set position and the second correction data, namely, the position data obtained by using the first noncontact sensor 40 and the encoders 33, 34 and 35. Consequently, the influence of the dimensional errors in the carrying apparatus 20 and the target 21 can be suppressed and the delivery position can be accurately measured. Thereby, the delivery position data on the delivery position can be obtained even if the target 21 is formed in a low dimensional accuracy, and the target 21 is inexpensive.

Figure 20:
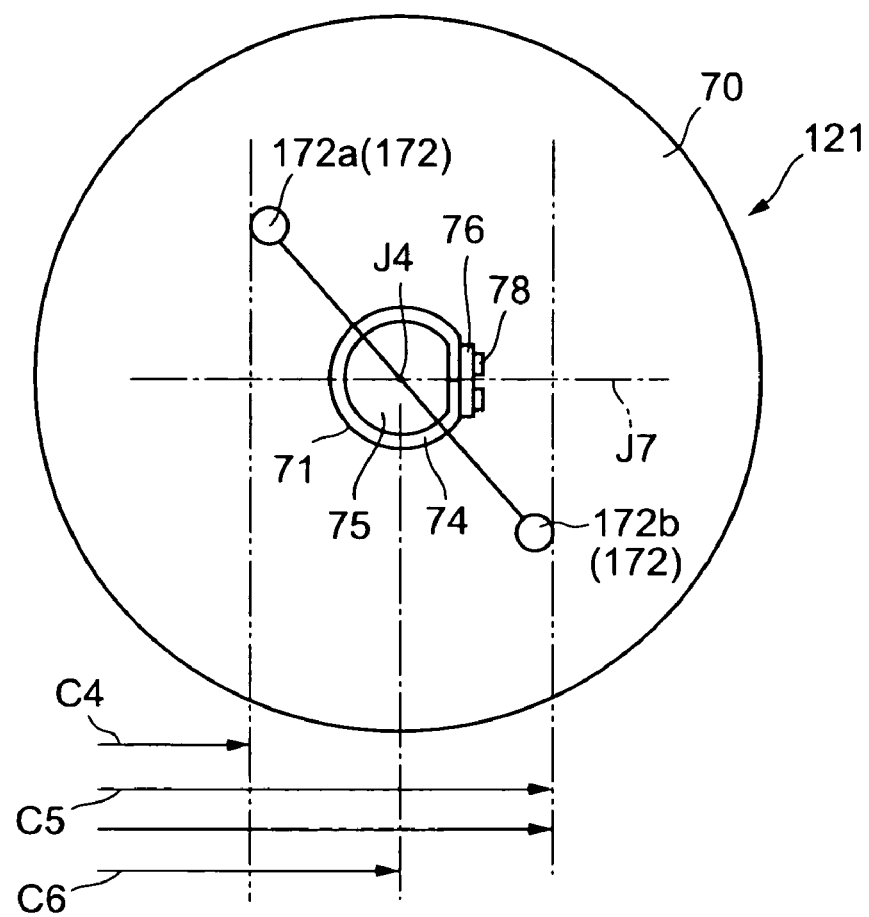
FIG. 20 is a plan view of a target to be detected which is employed in a delivery position data acquiring method in another embodiment according to the present invention.
Figure 21:
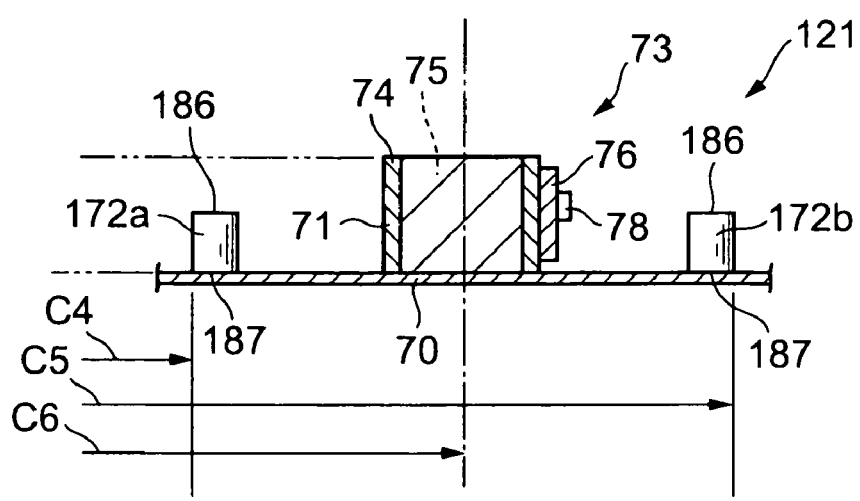
FIG. 21 is a sectional view of the target shown in FIG. 20.

FIG. 20 is a plan view of a target 121 employed by a delivery position data acquiring method in another embodiment according to the present invention, and FIG. 21 is a sectional view of the target 121 shown in FIG. 20. The target 121 is similar in construction to the target 21 shown in FIGS. 8 to 10 except a second part 172 to be detected which is different from the second part 72 shown in FIGS. 8 to 10. Therefore, parts like or corresponding to those shown in FIGS. 8 to 10 are denoted by the same reference characters and the description thereof will be omitted and only the second part 172 will be described.

The second part 172 includes two cylindrical projections 172a and 172b of the same shape disposed on a body 70 symmetrically with respect to the axis J4 of the body 70 so as to project axially from the body 70. The projections 172a and 172b are at the same radial distances from the axis J4 in opposite directions on a diameter. The sensor axis J5 is at a level corresponding to that of a point between the upper end 186 and the lower end 187 of each of the projections 172a and 172b.

The hand 22 is moved in the radial direction r with the radial axis J2 intersecting the axis J4 of the target 121. First, the sensor axis J5 comes into engagement with the projection 172a of the second part 172, moves across the projection 172a, leaves the projection 172a, comes into engagement with the projection 172b, moves across the projection 172b and leaves the projection 172b.

Suppose that the hand 22 is at a radial position C4 when the sensor axis J5 comes into engagement with the projection 172a, and the hand 22 is at a radial position C5 when the sensor axis J5 leaves the projection 172b. Then, the radial position C6 of the axis J4 of the target 121 is expressed by: C6={(C5−C4)/2}+C4. The delivery position data on the delivery position can be acquired by using the target 121.

The target 121 provided with the second part 172 has a thickness smaller than that of the target 21 shown in FIG. 8. Therefore, the delivery position data on the delivery position can be surely obtained even if only a small space is available for disposing the target 121 around the delivery position.

Figure 22:
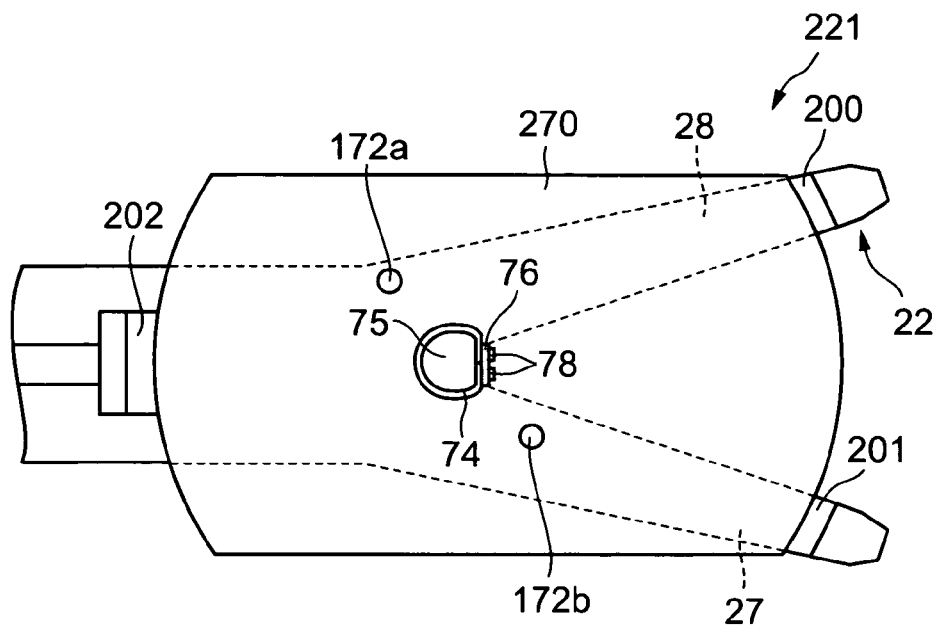
FIG. 22 is a plan view of a target to be detected which is employed in a delivery position data acquiring method in still another embodiment according to the present invention.
Figure 23:
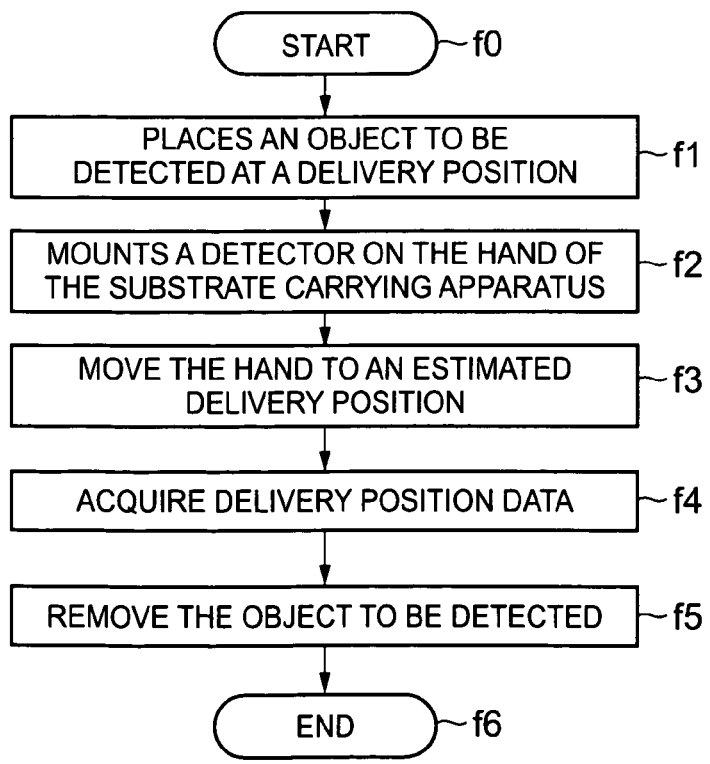
FIG. 23 is a flow chart of a conventional method of acquiring delivery position data.

FIG. 22 is a plan view of a target 221 employed by a delivery position data acquiring method in still another embodiment according to the present invention. The target 221 has a body 270 of a shape different from that of the base 70 of the target 121 shown in FIGS. 20 and 21. Therefore, only the body 270 will be described and the description of other parts like or corresponding to those of the target 121 will be omitted. The shape of the body 270 does not need to be the same as that of a semiconductor wafer 19. The body 270 may be formed in any suitable shape, provided that the target 221 can be held on the hand 22 in a predetermined positional relation with the hand 22. For example, when the hand 22 has three support parts 200, 201 and 202 on which peripheral parts of the semiconductor wafer 19 are supported, the body 270 may be formed such that the target 221 can be held on the three support parts 200, 201 and 202. The body 270 may be formed in a shape shown in FIG. 22. The body 270 is formed by cutting diametrically opposite segments from a circular plate. The target 221 can be formed in a small size.

The foregoing carrying apparatus 20 and the delivery position data acquiring operation are only examples. Although the invention has been described as applied to carrying substrates, such as semiconductor wafers, by the carrying apparatus 20, the present invention is applicable to other apparatuses for carrying workpieces other than substrates. For example, the present invention is applicable to a machining apparatus having a hand capable of holding and carrying a machining tool. Although the turning axis J1, the axis J3 of the semiconductor wafer and the axis J4 of the target 70 in the foregoing embodiment are supposed to be vertical, those axes may be extended in any desired directions other than the vertical directions Z. Carrying apparatus may be of any type, provided that its hand is capable of moving in a three-dimensional space.

Although the second noncontact sensor 41 is a mapping sensor incorporated into the carrying apparatus in the foregoing embodiments, the second non contact sensor 41 is not limited to the mapping sensor. If the delivery position data with respect to the radial direction r is unnecessary, acquisition of the delivery position data with respect to the radial direction r may be omitted. If the distance to the reflector with respect to the radial direction r can be determined on the basis of data provided by the first noncontact sensor 40, the second noncontact sensor 41 may be omitted. The calculating method of calculating the delivery position data on the delivery position explained in connection with FIGS. 9 and 10 is only an example. The present invention may calculate the delivery position data on the delivery position by detecting an optional edge part of the reflector 74.

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. A delivery position data acquiring method by which a carrying apparatus acquires delivery position data on a predetermined delivery position, the carrying apparatus including a holding member for holding an object to be delivered, member position data detecting means for detecting member position data on a position of the holding member, driving means for driving the holding member for movement, a laser beam projector physically coupled to the holding member, such that the laser beam projector moves together with the holding member, and a laser beam receiver disposed at a predetermined position with respect to the holding member to receive a laser beam, comprising:

a searching step of projecting a laser beam by the laser beam projector toward an object to be detected, which is previously disposed at a delivery position, while moving the holding member which is positioned apart from the object to be detected; and a delivery position data acquiring step of acquiring delivery position data by obtaining member position data provided by the member position data detecting means when a laser beam reflected by the object to be detected is received by the laser beam receiver and calculating the delivery position data based on the member position data obtained by the member position data detecting means, wherein the carrying apparatus is provided with first driving means for driving the holding member for angular displacement about a turning axis parallel to a carrying axis set at the delivery position and apart from the delivery position, and second driving means for driving the holding member for linear displacement along a direction parallel to the turning axis, and wherein the holding member is turned about the turning axis for angular displacement and is moved along the direction parallel to the turning axis for linear displacement in a noninterference space in which the holding member will not interfere with obstacles including other apparatus in the searching step.

2. The delivery position data acquiring method according to claim 1, wherein the object to be detected is provided with a regression reflection reflector capable of reflecting an incident light in a direction parallel to and opposite a direction in which the incident light travels, and
wherein the laser beam projector and the laser beam receiver are disposed coaxially or close to each other.

3. The delivery position data acquiring method according to claim 2, wherein the laser beam projector projects a polarized laser beam oscillating only in a predetermined first direction,
wherein the laser beam receiver receives a polarized laser beam oscillating only in a predetermined second direction, and
wherein the regression reflection reflector converts an incident laser beam oscillating in the first direction into a reflected laser beam oscillating in the second direction.

4. The delivery position data acquiring method according to claim 1, wherein the laser beam projector projects the laser beam in a direction perpendicular to the turning axis.

5. The delivery position data acquiring method according to claim 1, wherein the carrying apparatus includes an intersection detecting means disposed at a predetermined position with respect to the holding member for detecting a position of the object to be detected with respect to a direction intersecting a laser beam in a plane perpendicular to the turning axis, and third driving means for driving the holding member for movement in a direction perpendicular to the turning axis, the method further comprising:
a holding member translating step of moving the holding member toward the object to be detected based on the delivery position data calculated in the delivery position data acquiring step, and
a radial distance acquiring step of acquiring a radial distance of the delivery position by calculating delivery position data on the delivery position based on member position data obtained by the member position data detecting means when the object to be detected is detected by the intersection detecting means.

6. The delivery position data acquiring method according to claim 1, wherein the delivery position data is calculated based on a difference between a first correction data and a second correction data, the first correction data being obtained by the member position data detecting means when the object to be detected held by the holding member is transferred to a predetermined correction setting position, and the second correction data being obtained by the member position data detecting means when the laser beam receiver receives a reflected laser beam reflected by the object to be detected positioned at the correction setting position while moving the holding member with the laser beam projector projecting the laser beam toward the object to be detected.

7. A delivery position data acquiring system for acquiring delivery position data on a delivery position, comprising:
a carrying apparatus; and
an object to be detected capable of being held by the carrying apparatus,
wherein the carrying apparatus includes:
a holding member for holding an object to be delivered,
driving means for driving the holding member for movement,
member position data detecting means for detecting member position data on a position of the holding member,
a laser beam projector physically coupled to the holding member, such that the laser beam projector moves together with the holding member and capable of projecting a laser beam,
a laser beam receiver disposed at a predetermined position with respect to the holding member and capable of receiving a laser beam, and
control means for receiving member position data provided by the member position data detecting means when the laser beam receiver receives a laser beam reflected by the object to be detected and calculating delivery position data on a delivery position based on the member position data,
wherein the object to be detected has a part to be detected which is provided with a regression reflection reflector, the object to be detected being adapted to be held by the holding member,
wherein the carrying apparatus is provided with first driving means for driving the holding member for angular displacement about a turning axis parallel to a carrying axis set at the delivery position and apart from the delivery position, and second driving means for driving the holding member for linear displacement along a direction parallel to the turning axis, and
wherein the holding member is turned about the turning axis for angular displacement and is moved along the direction parallel to the turning axis for linear displacement in a noninterference space such that the holding member will not interfere with the operation of the laser beam projector or the laser beam receiver.

8. The delivery position data acquiring system according to claim 7, wherein the carrying apparatus is a substrate carrying apparatus for carrying a semiconductor wafer.

9. The delivery position data acquiring method according to claim 1, wherein the laser beam projector is fixed to an arm of the carrying apparatus, the arm being connected to the holding member.

10. The delivery position data acquiring system according to claim 7, wherein the laser beam projector is fixed to an arm of the carrying apparatus, the arm being connected to the holding member.

* * * * *